United States Patent [19]

Kosmowski

[11] Patent Number: 4,869,626
[45] Date of Patent: Sep. 26, 1989

[54] HIGH SPEED DRILLING SPINDLE

[75] Inventor: Wojciech B. Kosmowski, San Juan Capistrano, Calif.

[73] Assignee: Dynamotion Corporation, Santa Ana, Calif.

[21] Appl. No.: 194,417

[22] Filed: May 13, 1988

Related U.S. Application Data

[62] Division of Ser. No. 853,662, Apr. 18, 1986, Pat. No. 4,761,876.

[51] Int. Cl.$^4$ .................. B23B 47/06; B23B 47/20
[52] U.S. Cl. .................................. 408/129; 310/12; 310/42; 310/262; 384/12; 384/111; 408/124; 408/235; 409/231
[58] Field of Search .............. 408/124, 129, 130, 16, 408/8, 235; 409/231–233, 135; 310/12, 80, 112, 13, 14, 42, 262, 264; 384/12, 107, 111, 471

[56] References Cited

U.S. PATENT DOCUMENTS

| | | | |
|---|---|---|---|
| 1,067,500 | 7/1913 | Bondy | 408/234 |
| 2,648,238 | 8/1953 | Raney | 408/130 X |
| 2,993,391 | 7/1961 | Raney | 408/130 X |
| 3,246,188 | 4/1966 | McGarvey et al. | 310/262 X |
| 3,475,998 | 11/1969 | Steiner et al. | 408/8 |
| 3,555,962 | 1/1971 | Wolf et al. | 409/135 X |
| 3,753,384 | 8/1973 | Anfindsen | 408/129 X |
| 4,088,417 | 5/1978 | Kosmowski | 408/137 X |
| 4,095,855 | 6/1978 | Fox | 384/109 |
| 4,534,686 | 8/1985 | Nakamura et al. | 408/231 X |
| 4,596,067 | 6/1986 | Raiteri | 408/16 X |

Primary Examiner—Steven C. Bishop
Attorney, Agent, or Firm—Roberts and Quiogue

[57] ABSTRACT

A high speed drilling system is disclosed for high speed drilling of very small holes in workpieces such as printed circuit boards. The X-Y positioning system includes air bearings to provide lift between the stationary guide beams, the crossbeam and the top table, and further includes a vacuum preloading apparatus for providing a preloading force between the table and the guide beam. The preload force dampens Z axis oscillations which can result in drill bit breakage. The top table is a lightweight honeycomb structure, whose effective rigidity is virtually that of the guide beam due to the vacuum preloading. The system includes pairs of spindles, one a conventional spindle for drilling holes larger than about 0.125 inches, and the other a high speed spindle for drilling holes in the range of about 0.003 to 0.125 inches. The high speed spindle includes a stationary spindle body carrying the stator of the rotary drive motor. Only the spindle rotor is translated along the Z axis to perform the drilling movements. The rotor is supported within the spindle body by rotary and linear air bearings, and is axially driven by a linear motor. A toolchanger loaded by clips carrying the drilling bits is mounted on the top work table, and minimizes the time required to change drilling tools. The clips minimize the manual handling of the fragile drill bits. A vacuum hold-down appratus is employed to secure the workpieces to a drilling station.

51 Claims, 7 Drawing Sheets

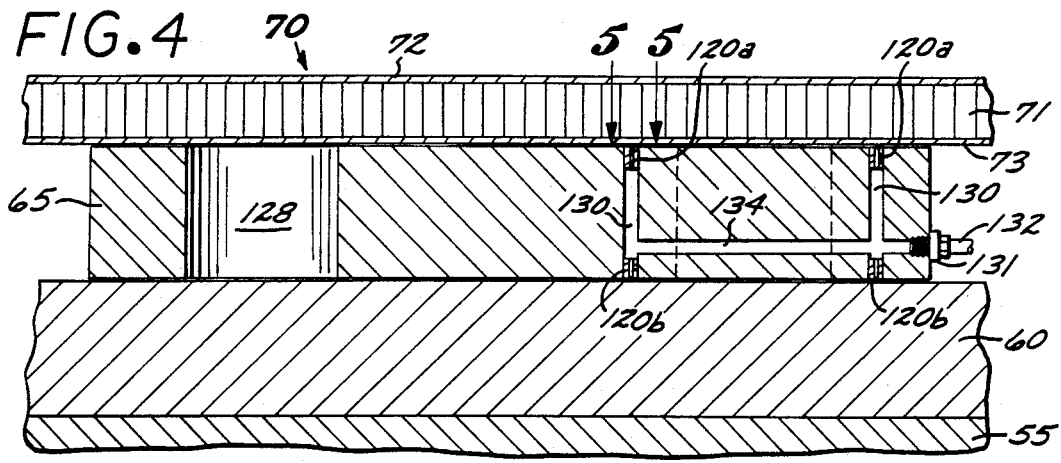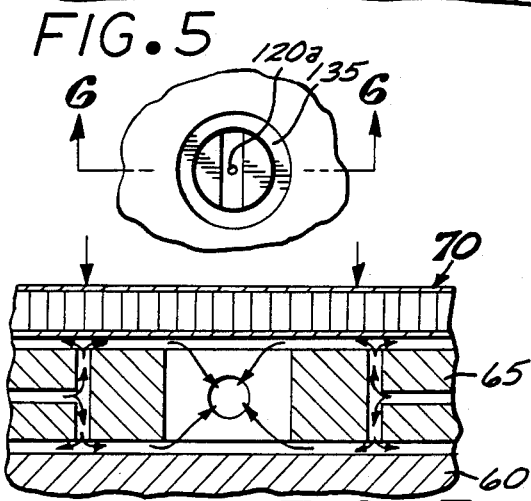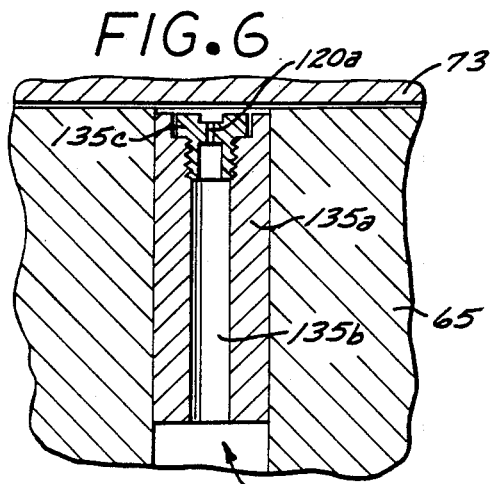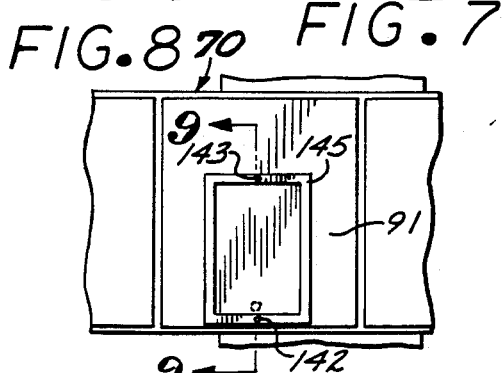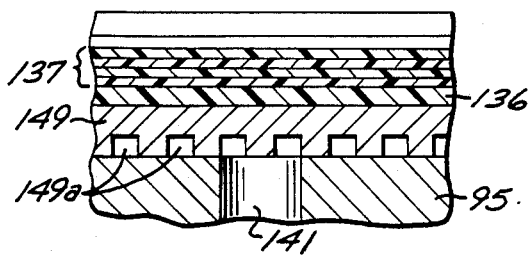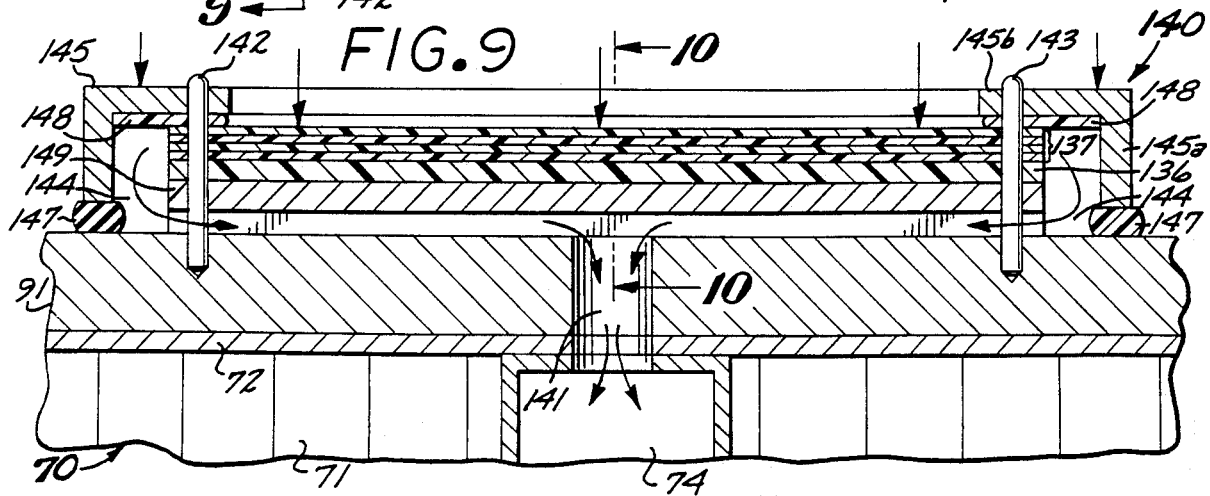

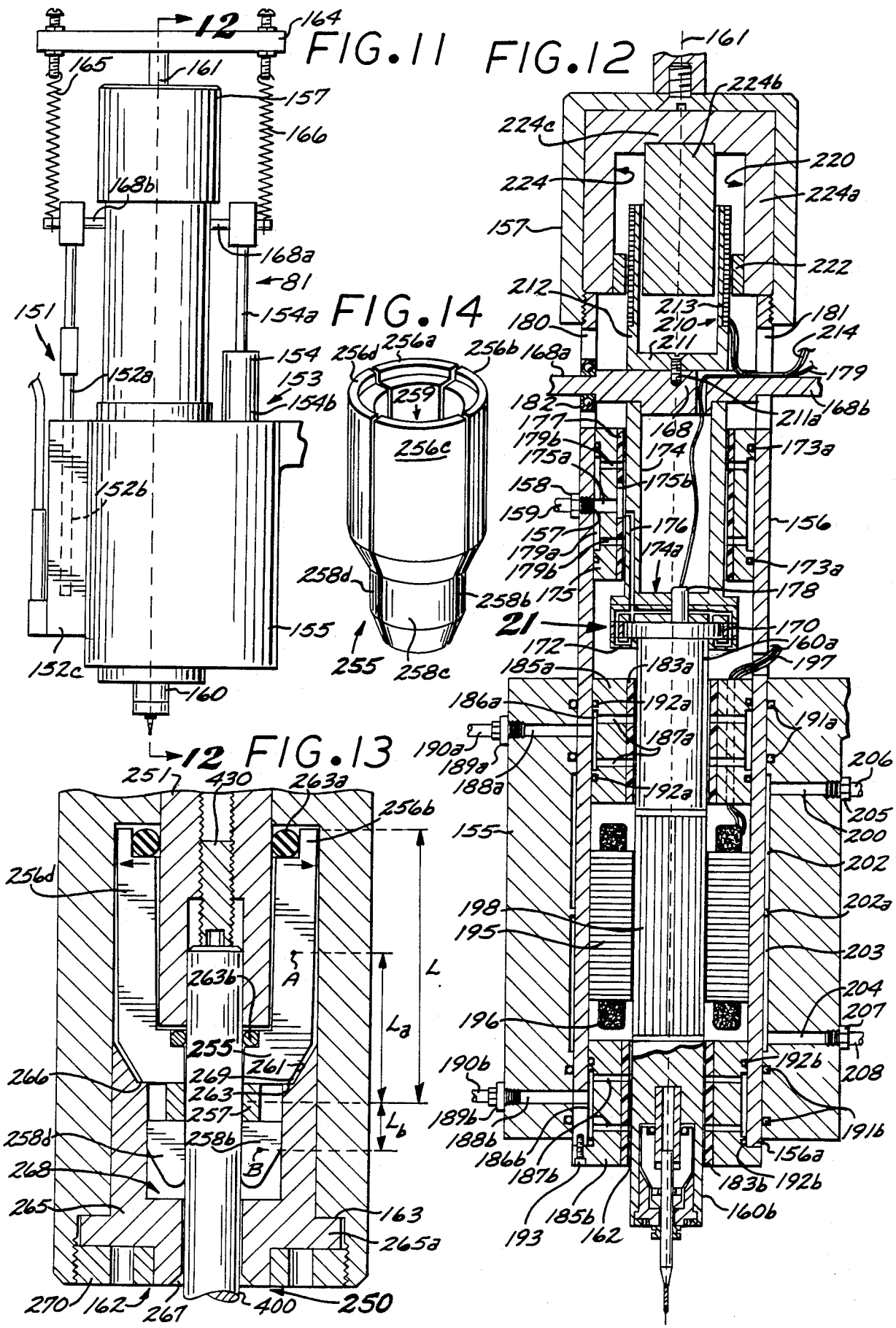

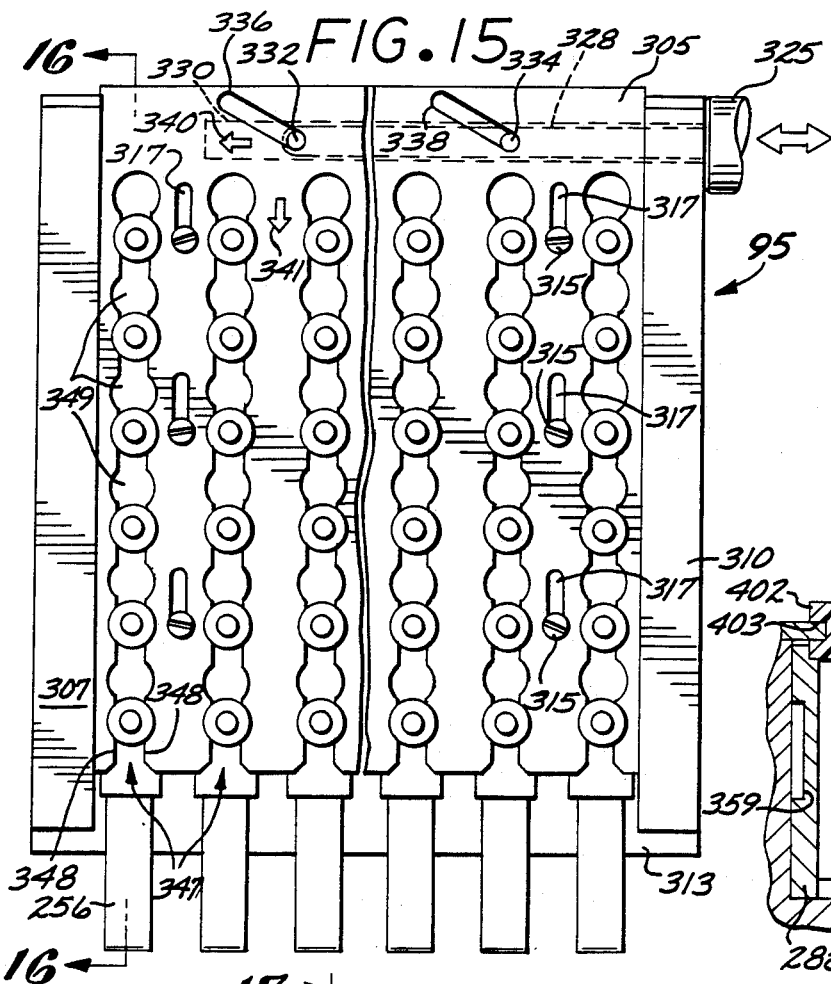
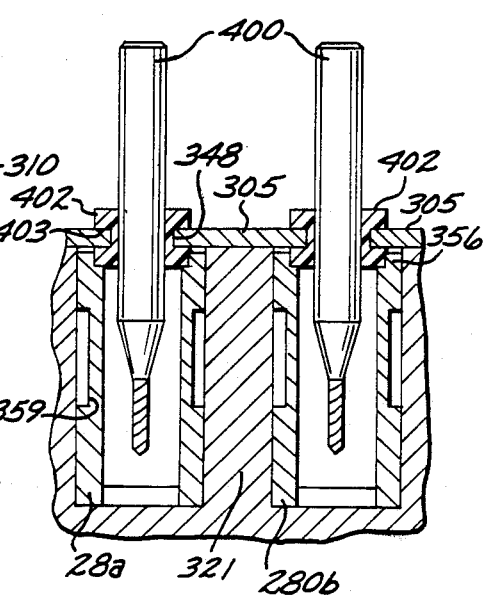
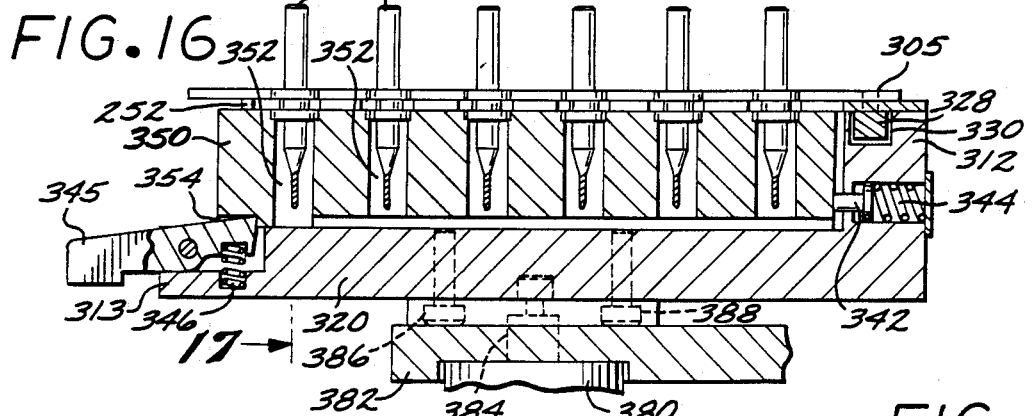
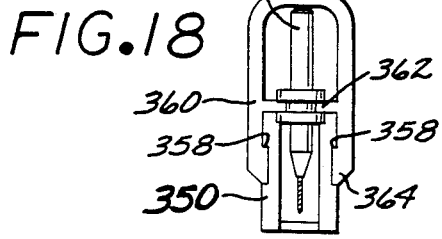
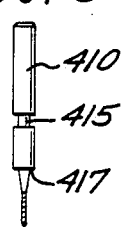
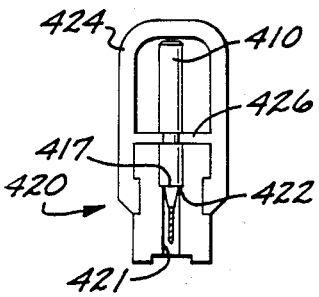

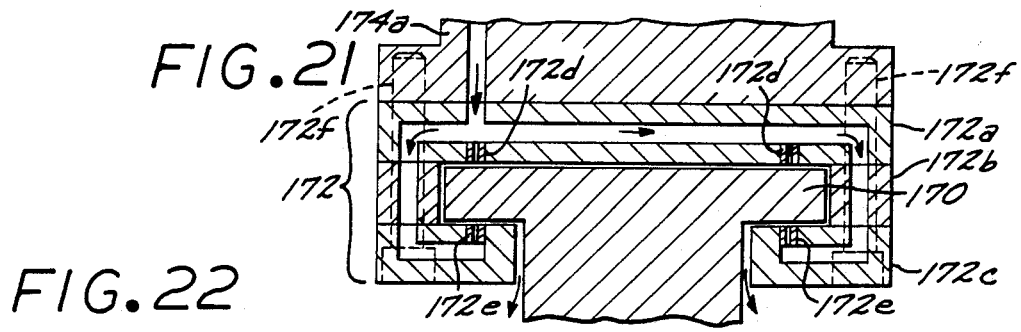
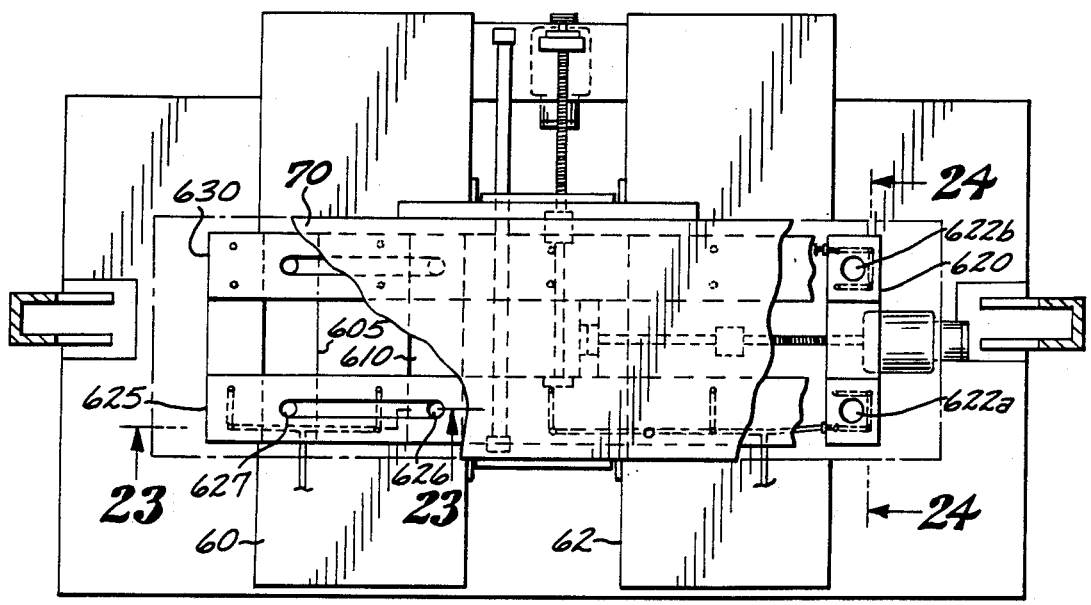
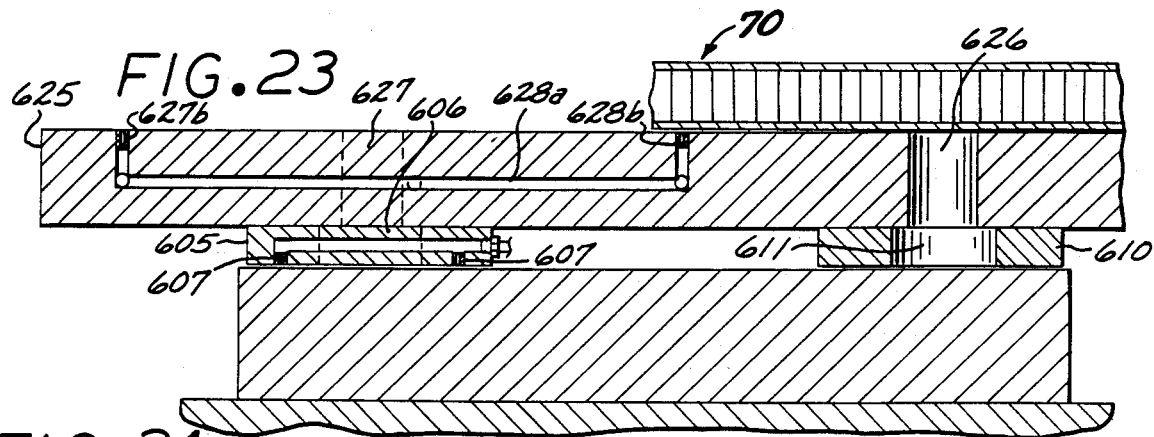
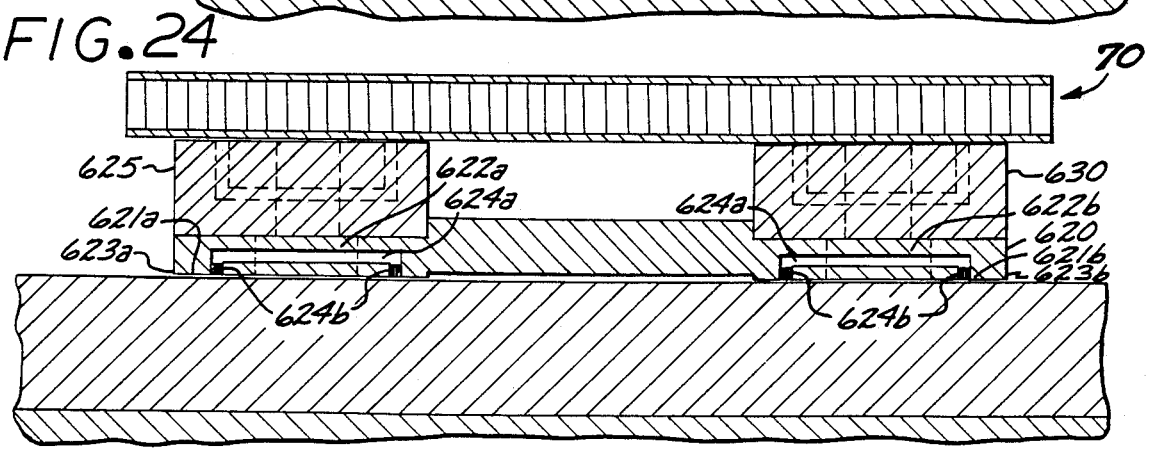

HIGH SPEED DRILLING SPINDLE

This is a division, of application Ser. No. 06/853,662, filed Apr. 18, 1986, now U.S. Pat. No. 4,761,876.

BACKGROUND OF THE INVENTION

The present invention relates to high speed drilling systems for precision drilling of workpieces such as printed circuit boards and the like, and more particularly to systems for drilling very small diameter holes in such workpieces at high speed.

Printed circuit boards are in universal use today to mount and interconnect electrical components forming electrical circuits. Typically, the leads of the components are inserted through holes drilled in the boards to form predetermined hole patterns. Various systems are known in the art for automated drilling of the holes in printed circuit boards. Examples of such systems and components thereof are described in U.S. Pat. Nos. 4,088,417; 3,578,827 and 3,973,863. Such systems typically employ multiple spindles, and are numerically controlled to drill the workpieces in accordance with a predetermined drilling sequence. The systems typically employ automatic tool-changing devices to allow the drill tool to be rapidly changed during the drilling sequence. The workpiece is mounted on a table supported for X-Y translational movement to accurately position the workpiece in relation to the drill spindles. Typically, the work table is supported by a plurality of air bearings on a granite beam, and a lead screw mechanism is provided to allow the capability of translation along one of the X-Y axes. The granite beam is in turn typically supported above a granite base by a plurality of air bearings and another lead screw mechanism provides the capability of translation along the other of the X-Y axes.

Printed circuit boards used today may employ holes of very small diameters, e.g., as small as four thousandths of an inch, with as many as forty thousand holes per board, to accommodate high component densities on the board. There are a number of problems in drilling such small holes with high speed and the required precision.

One of the most detrimental problems for small hole drilling is the Z axis vibration during drilling, which results in drilling tool breakage. Printed circuit board drilling machines are typically multi-station devices to increase the throughput, and relatively large moving tables are required to accommodate all work stations. To meet high speed operating requirements, the work table supporting the workpieces are made as lightweight as possible. Because the conventional work table is constructed from cast iron, the table is generally quite thin to reduce the weight. In conventional systems, these tables are usually supported by the air bearings at four or six points. This configuration results in a "drum" effect when the pressure feet for the respective tool spindles hit the table supported workpiece to hold the workpiece down as the spindles are lowered for drilling operation. The impact of each pressure foot causes vibrations in the table creating motion in the direction of the advancing bit, consequently dramatically increasing the chip load on the drill bit. This condition is one of the main causes of small drill bit breakage. Work table oscillations also result from the acceleration and deceleration of the work table to rapidly position the workpieces.

Conventional spindles presently used in P.C.B. drilling systems rotate the drill as it is gripped by one of many types of chucking devices. One type of chuck is the centrifugal chuck which apply gripping forces on the drill bit caused by the centrifugal forces set up by the high speed rotation of the spindle and bit. There are some disadvantages to these conventional chuck types, including insufficient bit clamping force at lower speeds, lack of concentricity of the bit and the spindle axis, control of the runout of the bit, and control of the depth of insertion of the bit. Moreover, in conventional systems, the entire spindle, including the heavy spindle body, is lowered and raised to accomplish the drilling, thereby tending to set up relatively high reaction forces and vibration during the rapid acceleration and deceleration of the spindle required for high speed drilling operations.

It would therefore represent an advance in the art to provide a drilling system capable of high speed drilling of small diameter (on the order of 0.003 to 0.06 inches in diameter) holes in workpieces such as printed circuit boards and substrates.

SUMMARY OF THE INVENTION

A new high speed drilling system is disclosed. One aspect of the invention is the X-Y positioning system employed to position the workpiece beneath the stationary (relative to X-Y coordinates) drilling spindle. The workpiece is supported by a work table, suspended by air bearings above a floating crossbeam, which is in turn suspended above stationary guide beams by air bearings. X-axis translation is accomplished by a servomotor-driven leadscrew coupling the work table and the floating crossbeam. Y-axis translation is accomplished by a servo-motor-driven leadscrew coupling the floating crossbeam to the stationary guide beams.

In accordance with one aspect of the invention, the respective air bearings between the respective work table the floating crossbeam and the guide beams support substantial areas between the translating surfaces. This novel air bearing configuration operates cooperatively with a plurality of distributed vacuum chambers to provide a vacuum preloading force tending to draw together the adjacent surfaces of the work table and the crossbeam, and the adjacent surfaces of the crossbeam and the guide beams. The vacuum preloading forces are opposed by the air bearings acting on the adjacent respective surfaces surrounding the vacuum chambers. The vacuum preload forces is significantly larger than the forces developed by the spindle pressure foot in clamping a workpiece, thereby substantially eliminating the work table vibration caused by the impact of the pressure foot on the workpiece. The vacuum preloading coupled with the distribution of the air bearing over large translating areas contributes to outstanding work table rigidity unobtainable by conventional table designs wherein the table is suspended on four to six bearing points or feet. With the vacuum preloading, the stiffness of the work table is virtually equal to the machine base table.

Due to the novel air bearing and vacuum pre-load arrangement described above, the work table need not be inherently very stiff, and can therefore be very light. In accordance with another aspect of the invention, the work table is fabricated by sandwiching a metal honeycomb structure between two thin plates of stainless steel. The mass of such a structure is reduced by as much as 80% over conventional solid tables, and can therefore be accelerated faster by the lead screws while using smaller servo motors. This results in reduced wear on the translation system components, and increased productivity resulting from the increased speed.

Another aspect of the invention is the type of high speed spindle which is employed as part of the drilling system. The spindle employs a novel centrifugal chuck for gripping the drill bit, resulting in improved grip and concentricity of the bit with the spindle axis. The chuck is designed in such a fashion that the centrifugal forces on the bit are multiplied through pairs of opposing lever arms. The chuck is designed as a unitary element to prevent relative motion of the rotating components during operation and to eliminate potential balance problems. Due to its balanced, unitary design, the chuck does not produce axial displacement resulting from the process of gripping the bit, in contrast to the tapered chucks in common use today.

Runout of the drill is minimized by separate alignment bushings mounted concentrically to the rotational axis of the spindle for centering the chuck. The initial bit gripping force, when the spindle is not rotating, is generated by the spring action of an O ring held under compression forcing the lever arms of the chuck outward, and a circular spring providing a static frictional engagement of the drill shank.

Another aspect of the invention is the spindle arrangement allowing simultaneous rotary and linear motion of the rotor, making it possible to move the rotor up and down to perform the drilling strokes while the rotor is rotating. To carry out this function, the spindle rotor is rotated by an AC brushless motor stator fixed in the spindle housing. The rotor is longer than the extent of the stator windings to allow axial movement without disturbing the rotary operation. The rotor is supported for axial and rotary motion relative to the spindle housing by circular and linear air bearings.

The top of the spindle rotor is coupled by a thrust air bearing to a non-rotating plunger element mounted for axial movement within the spindle housing. The plunger is in turn coupled to the moving coil of a linear motor which is moved up and down in reaction to the electromotive forces created by the electric current applied to the linear motor coil. Thus, the linear motor arrangement provides the capability of raising or lowering the spindle rotor simultaneously as the rotor is being rotated at high speed.

The weight of the rotor represents only a fraction of the total spindle weight. Because only the rotor, plunger and moving coil is translated up and down, while the spindle body remains stationary, the relatively lightweight rotor can be linearly accelerated and decelerated without generating high reaction forces and high vibration levels. The arrangement eliminates the compliance of conventional spindle drives, and provides the smooth, vibration-free spindle feed necessary for successful drilling of small holes.

A further aspect of the invention resides in the tool changers. The tool changer is carried by the work table and supplies the various tools, i.e., the various sizes of drill bits utilized during the workpiece drilling operation of the disclosed embodiment. In accordance with the invention, the bits are supplied in clips, each carrying six bits. The clips are provided with clip covers which protect the bits against damage or loss during clip shipment or storage. The covers are removed prior to inserting the clips into the magazines of the tool changer.

A novel tool clip is employed to ship and store the drill bits and to load the magazines of the toolchanger. The small size of the drill bits renders them subject to breakage or damage from handling as well as from actual operating breakages. The clips further provide a means for virtual elimination of manual handling of the drill bits. The clip comprises a elongated housing member which includes six bores formed therein for receiving the drill bits. Each bore is countersunk to provide a shoulder surface. A clip cover is provided to protect against bit loss or damage during shipment or storage. The cover is removed prior to loading the clip into the toolchanger magazine.

Special bit configurations are employed for the bits to be loaded into the clip. In one embodiment a collar is fitted around the shank of each bit, and has an outer circumferential groove to be engaged by portions of the clip cover to lock the bit into position within the clip. The collar mates against a counterbored shoulder in the clip housing to control the depth of insertion of the bit into the clip housing.

In another embodiment, a shoulder and a groove are formed in the bit shank. The shoulder mates against the counterbored shoulder in the clip housing to control the depth of bit insertion into the bore, and portions of the clip cover engage the groove in the bit shank to secure the bit in the clip while the clip cover is installed on the clip housing.

Each toolchanger is carried along a front edge of the work table, and comprises a magazine into which a plurality of tool clips (e.g, six) may be loaded. The magazine comprises a top locking plate. A plurality of elongated slots are formed in the top plate. The thickness of the top plate and the slot width is such that the slot edges engage into the groove formed in the bit shank or alternatively the bit collar as the clip is loaded into the magazine. The elongated slots have a plurality of enlarged clearance openings spaced along the slot. The toolchanger includes a pneumatic mechanism for translating the locking plate horizontally along the slot axis between locked and unlocked positions. With the locking plate in the locked position, the bits are locked in place by the engagement of the slot edges into the respective grooves formed in the bit (or bit collar), and may not be removed. With the locking plate in the unlocked position, the enlarged openings in the slots are aligned with the bit axes, providing clearance between the slot edge and the bit (or bit collar), thereby allowing the bits to be removed from or inserted in the toolchanger.

The toolchangers are supported by pneumatic mechanisms for movement along the Z-axis, to raise or lower the toolchanger in relation to its associated spindle(s). To load a tool into the spindle, the work table is positioned such that the desired bit in the magazine is disposed directly beneath the spindle. With the spindle rotor in the zero or home position, the toolchanger is raised to place the bit shank within the centrifugal chuck so that the bit is gripped by the chuck. The toolchanger then is lowered beneath the level of the work surface and the drilling operation commences. This cycle is reversed to replace the bit in the clip.

Utilization of the integrated toolchanger eliminates the need for a separate bit transfer system for transporting the bits between the spindle and a tool storage location, and results in faster toolchanging than conventional systems.

Conventional drilling systems employ spindle pressure feet to secure the workpiece while the drilling operation takes place. The pressure feet strike the workpiece with considerable force, causing vibrations which tend to cause bit breakage. To solve this problem, a vacuum frame fixture is employed in the system to secure the workpiece in the appropriate location. An opening is provided in the top surface of the work table; this opening communicates with a source of vacuum. A tool plate, also with a large vacuum opening formed therein, is disposed on the work table with the opening in the tool plate in alignment with the opening in the work table. A vacuum chuck member is placed on the flat plate, and comprises a flat top surface and a bottom surface having a plurality of transverse elongated relieved areas defined therein.

A backup board and a stack of the thin workpieces to be drilled are laid on the flat surface of the vacuum chuck member. A frame is then placed around the periphery of the board stack, and comprises a rectilinear side fixture region with a flexible vacuum seal which contacts the flat plate, and a top fixture region with a flexible vacuum seal which contacts the top periphery of the top workpiece in the stack. The fixture and vacuum chuck member serves to define a sealed chamber around the periphery of the workpiece stack. As a source of vacuum is applied to the opening in the flat plate, air is drawn along the transverse relieved areas of the vacuum chuck to evacuate the seal chamber. The atmospheric pressure on the exposed surface of the topmost board firmly depresses the boards to a flattened state, and the seals compress so that the frame clamps the periphery of the board stack to the work table. During the drilling sequence, the depth of the drill insertion is controlled such that the bit does not penetrate the backup board. Thus, drilling holes in the workpiece does not break the vacuum seal securing the workpieces.

BRIEF DESCRIPTION OF THE DRAWINGS

These and other features and advantages of the present invention will become more apparent from the following detailed description of exemplary embodiments thereof, as illustrated in the accompanying drawings, in which:

FIG. 4 is a partial cross-sectional side view of the machine of FIG. 1, taken along line 4—4 of FIG. 2.

FIG. 5 is a cross-sectional top view illustrating one air orifice comprising the air bearing between the top work table and the crossbeam of the machine of FIG. 1, taken along line 5—5 of FIG. 4.

FIG. 6 is a cross-sectional side view of the structure of the air bearing shown in FIG. 5, taken along line 6—6 of FIG. 5.

FIG. 7 is a diagramatic cross-sectional view of the work table, the crossbeam and a guide beam, illustrating the air bearing and vacuum preloading.

FIG. 8 is a top plan view of a portion of the top work table of the machine of FIG. 1, illustrating one of the four tooling plates and workpiece hold-down structures employed in the operation of the machine of FIG. 1.

FIG. 9 is a cross-sectional side view further illustrative of the tooling plate and hold-down structure of FIG. 8, taken along line 9—9 of FIG. 8.

FIG. 10 is a cross-sectional side view further illustrative of the tooling plate and hold-down structure of FIG. 8, taken along line 10—10 of FIG. 9.

FIG. 11 is an enlarged front plan view of one high speed drilling spindle of the machine of FIG. 1.

FIG. 12 is a longitudinal cross-sectional view of the spindle taken through line 12—12 of FIG. 11.

FIG. 13 is an enlarged cross-sectional view of the rotor and centrifugal chuck assembly comprising the high speed drilling spindle of FIG. 11.

FIG. 14 is a perspective view of the unitary centrifugal chuck comprising the high speed drilling spindle of FIG. 11.

FIG. 15 is a top plan view of an exemplary one of the four toolchangers comprising the drilling machine of FIG. 1.

FIG. 16 is a cross-sectional view illustrating one magazine and tool clip of the toolchanger taken along line 16—16 of FIG. 15.

FIG. 17 is a cross-sectional side view of two adjacent magazines of the toolchanger taken along line 17—17 of FIG. 16.

FIG. 18 is a cross-sectional side view of one exemplary tool clip carrying one conventional type of drill for loading magazines of the tool changer.

FIG. 19 is a frontal view of a drilling tool embodying one aspect of the invention.

FIG. 20 is a cross-sectional view of a tool clip carrying the new drill of FIG. 19.

FIG. 21 is a cross-sectional view illustrative of the thrust bearing securing the rotor shaft thrust flange to the plunger.

FIG. 22 is a top view of a drilling system employing an alternate crossbeam configuration.

FIGS. 23 and 24 are respective cross-sectional frontal and side views taken along lines 23 and 24 of FIG. 22, illustrating the alternate crossbeam structure in further detail.

DETAILED DESCRIPTION OF THE PREFERRED EMBODIMENT

Figure 1:
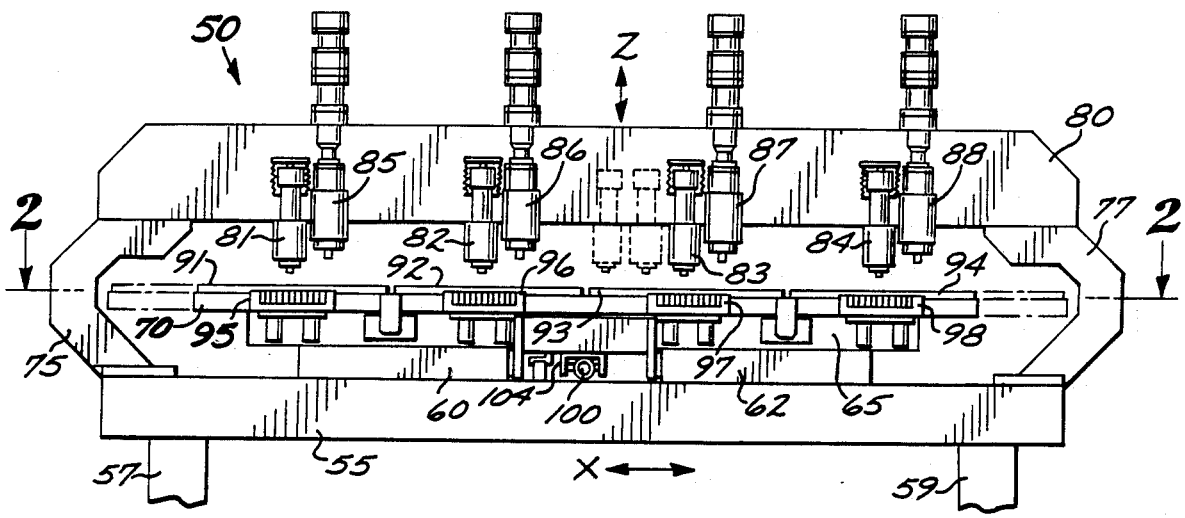
FIG. 1 is a frontal plan view of a high speed drilling machine embodying the invention.

A preferred embodiment of a precision high speed drilling system embodying the invention is depicted in the front plan view of FIG. 1. The system 50 comprises a horizontal lower granite base table 55 supported by granite pedestals 57 and 59. A pair of granite guide beams 60 and 62 are attached to the base table 55. Granite crossbeam 65 is disposed on the two guide beams 60 and 62. During system operation, the crossbeam is supported above the guide beams by air bearings, to be described in further detail below.

Figure 25:
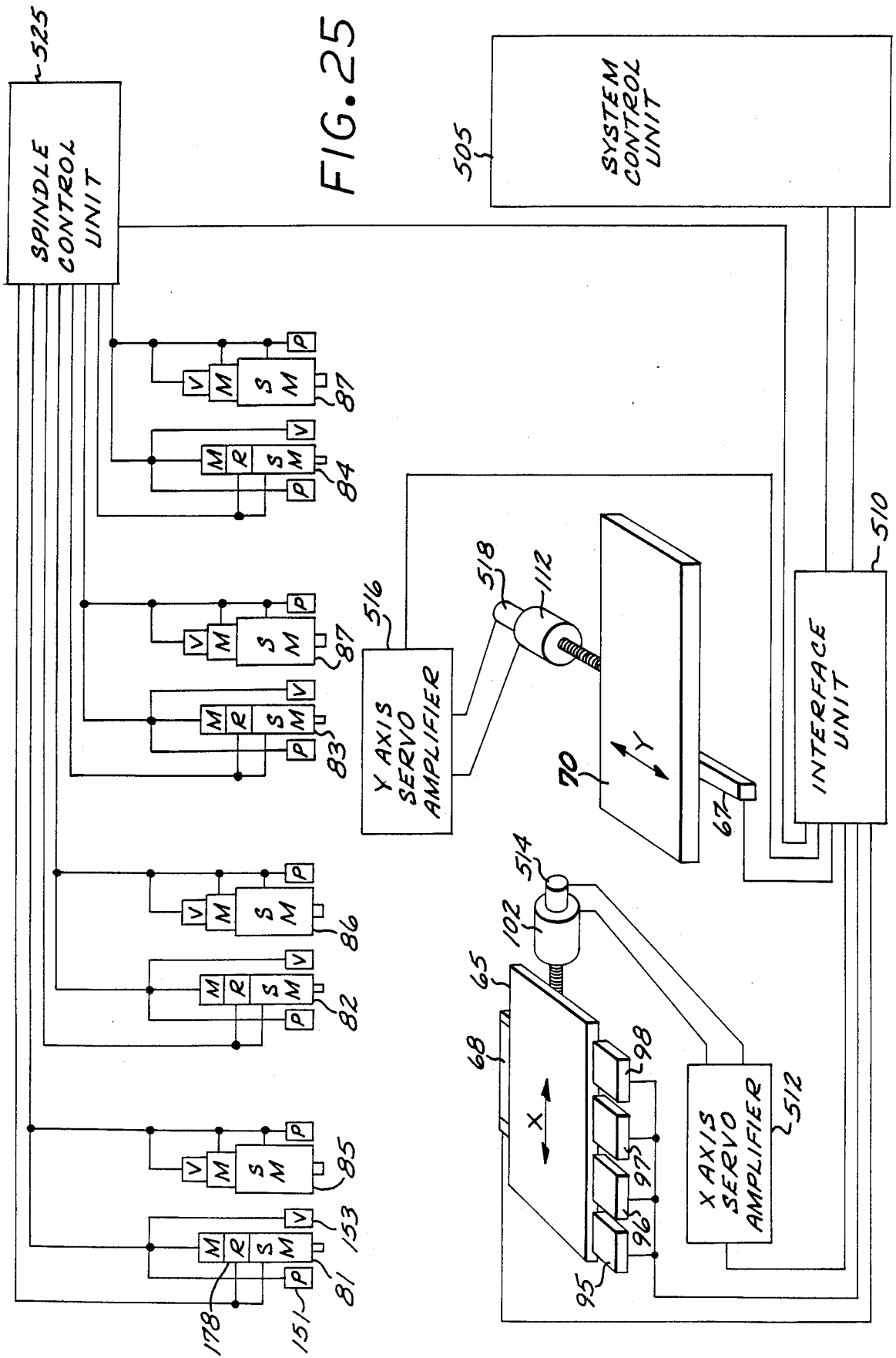
FIG. 25 is a schematic block diagram illustrative of the control system for controlling the operation of the drilling system depicted in FIG. 1.

The system 50 includes means for translating the crossbeam 65 along the Y axis in relation to the guide beams 60 and 62 in dependence on control signals provided by the system control unit (FIG. 25). The translating means comprises a precision lead screw arrangement, visible in FIG. 2, driven by a servo motor which is controlled by the system control unit in the conventional manner. Such translating means are well known to those skilled in the art.

A work table 70 is supported above the crossbeam 65 by air bearing means. The system 50 further comprises means for translating the work table 70 along the X axis in relation to the crossbeam 65. This translating means also comprises a precision leadscrew arrangement driven by a servo motor controlled by the system control unit, in a manner similar to that described above with respect to the translating means for the crossbeam 65.

A granite top support beam 80 is permanently supported above the work table 70 by a pair of C-shaped uprights 75 and 77. The top beam 80 in turn supports a plurality of drilling spindles. In accordance with one aspect of the invention, the system comprises a plurality of pairs of drilling spindles; one spindle of each pair is adapted for drilling of medium to large diameter holes in workpieces, and the second spindle is adapted for high speed drilling of small diameter holes. Thus, the high speed spindles 81–84 are respectively paired with the conventional spindles 85–88. Each pair of spindles are mounted in a side-by-side relationship above corresponding tooling plates 91–94 which are in turn mounted on the work table 70. The respective translating means for the crossbeam 65 and the top work table 70 provide a means for precisely positioning the work table 70 in relation to the X-Y location of the spindles.

The system 50 depicted in FIG. 1 comprises four drilling work stations comprising the respective tooling plates 91–94 and the pairs of drilling spindles. The control unit is programmed to select the appropriate drilling spindle of the respective spindle pairs for drilling a particular hole in a workpiece secured to a tooling plate, and to automatically carry out a sequence of drilling movements to drill a predetermined pattern of holes of varying predetermined sizes in the workpiece.

A plurality of toolchangers 95–98 are also depicted in FIG. 1, one for each of the drilling stations of the system. The toolchangers are adapted to cooperate with the spindles and translating means to provide a means for supplying the appropriate spindles with the appropriate drilling tools under control of the system control unit. As will be described in further detail below, the toolchangers are adapted to perform their functions with a minimum of required movements, thereby minimizing the time required for toolchanging.

X-Y Positioning System with Vacuum Pre-loading

Figure 2:
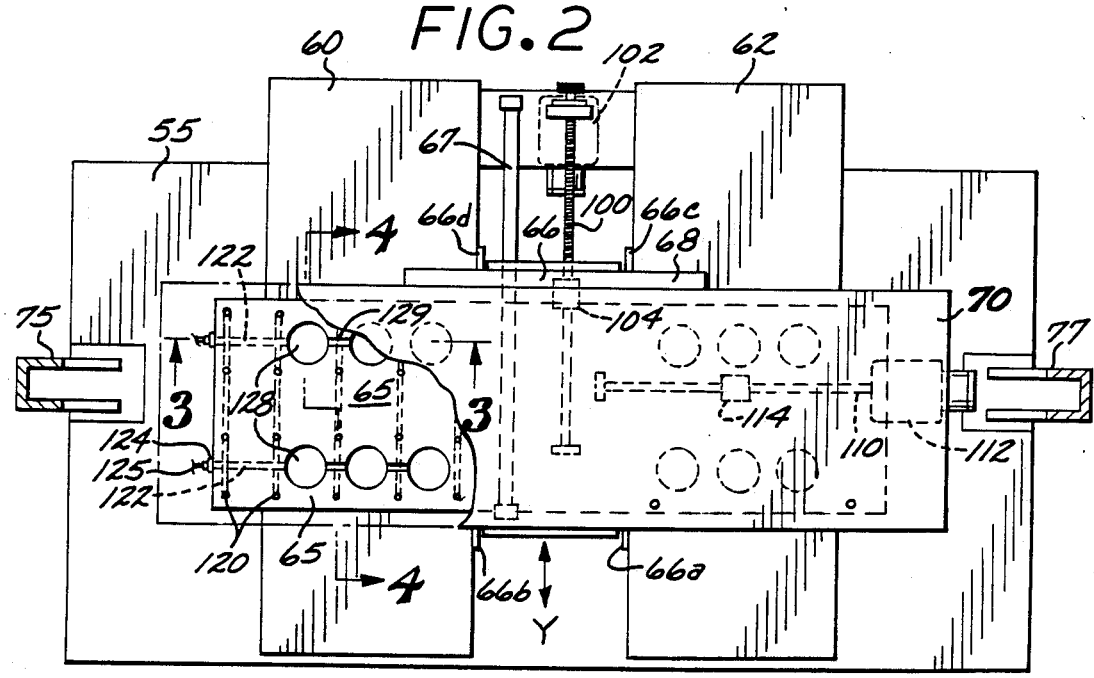
FIG. 2 is a cross-sectional, partially broken-away top view of the machine of FIG. 1, taken along line 2—2.

Referring now to FIG. 2, a top cross-sectional view of the system 50 is shown, taken along line 2-2 of FIG. 1. The translating means for positioning the crossbeam 65 in relation to the guide beams 60 and 62 comprises the precision leadscrew 100 and a drive mechanism including the servo motor 102 and a coupling device for coupling the motor shaft to the leadscrew. The leadscrew 100 is substantially aligned with the Y axis and attached by ballnut 104 to the cradle 66, in turn secured to the bottom surface of the crossbeam 65 so as to fit between the two guide beams 60 and 62. Cradle 66 houses four air bearings whose locations are indicated generally by reference numerals 66a–d in FIG. 2, providing guiding for the cross beam 65 along the edges of the guide beams 60 and 62, to constrain the movement of the crossbeam 65 relative to the guide beams to the Y direction. Rotational energy of the leadscrew 100 (driven by the motor 102) is transferred into a translating force tending to translate the crossbeam along the axis of the leadscrew 100, with the direction of the imparted force being determined by the direction of rotation of the leadscrew, i.e., clockwise or counterclockwise. The means for translating the work table 70 similarly comprises leadscrew 110, substantially aligned with the X-axis, servo motor 112 and ballnut 114, which is secured to the underside of table 70. By appropriate rotation of the leadscrew 110 by the motor 112, a force is imparted to the table 70 tending to translate the table along the axis of the leadscrew 110. X and Y linear scales 66 and 67 provide electrical signals to the system control unit indicative of the respective X and Y position of the crossbeam 65 and table 70.

The crossbeam 65 is preferably constructed of granite. The system is provided with air bearings to allow virtually friction-less movement between the respective guide beams 60 and 62, the crossbeam 65, and the work table 70. The air bearings comprise a supply of pressurized air (not shown). A plurality of orifices 120a and 120b are provided in the upper and lower surfaces of the crossbeam 65 in communication with the air source by vertical air channels 130 and horizontal channels 134 bored in the crossbeam 65, air fittings 131, and air supply lines 132 (FIG. 4). In this embodiment, the air bearing is distributed over the area of the sliding surfaces of the respective guide beams 60 an 62, the crossbeam 65 and the work table 70, instead of operating only on localized supporting feet. Thus, while the use of air bearings in drilling systems is itself not new, one aspect of the invention resides in the distribution of the air bearing to support large areas of the sliding surfaces of the X-Y positioning system.

Another aspect of the invention is the provision of means for exerting a preloading force (in addition to gravity) tending to oppose the air bearing lift pressure separating the respective guide beams 60 and 62, the crossbeam 65 and the work table 70. The preloading means comprises a plurality of vacuum chambers 128 which are formed in the crossbeam 65 as shown in FIG. 2. The chambers 128 comprise relative large diameter openings, for example, about 3.0 inches, formed through the crossbeam 65. In this embodiment, a total of twelve vacuum chambers 128 are formed in the crossbeam 65, six chambers above the guide beam 60, and six additional chambers above the second guide 62. The width dimension of the crossbeam is selected in cooperation with the maximum allowable excursions of the crossbeam 65 so that all six chambers are always between the upper surfaces of the respective beams 60 and 62 and the lower surface of the top work table 70. In this embodiment, the crossbeam 65 is about 20 inches wide, 70 inches long, and 3.5 inches in thickness. This distribution of the chambers 128 serves to ensure that the preload force is substantially constant over the entire range of movement of the respective guide beams 60 and 62, the crossbeam 65, and the top table 70.

The vacuum chambers 128 are respectively coupled to a source of vacuum (not shown) via bores 122 which are formed in the crossbeam 65, fittings 124 and vacuum lines 125. Slots 129 are formed between the six chambers forming each group of six chambers to couple all the chambers of that group to the source of vacuum. The second group of six chambers 128 is coupled by a similar arrangement to the source of vacuum. In this embodiment, the source of vacuum is preferably a vacuum pump developing 2-3 psi.

The vacuum chambers provide a means for damping the magnitude of any movements of the crossbeam 65 and the top work table 70 in the Z axis direction resulting from forces applied during the operating of the system. Such forces arise from the reaction forces resulting from the acceleration and deceleration of the respective beam 65 and the work table 70 during X-Y translation, and from the impact of the drilling tools in the Z direction. In conventional systems, these forces result in substantial Z axis oscillations of the work table 70, impairing the accuracy of the drilling operations and exerting Z axis forces on the drilling tools, which for drills of relatively small diameter would result in tool breakage. The present system is adapted to minimize such oscillations, allowing high speed drilling of very small diameter holes in the workpieces. The preloading force applied by the vacuum preload system is selected to be greater than the impact forces in the work table 70 resulting from the impact of the drilling tool and the spindle pressure feet. For the disclosed embodiment, the preload force resulting from the twelve vacuum chambers, each three inches in diameter is about 260 pounds. With the vacuum preloading, the rigidity of the top work table 70 is virtually that of the stationary guide beams 60 and 62, and consequently that of the base table 55.

Another advantage of the vacuum preloading means is that, because the rigidity of the table 70 is now virtually that of the granite base table 55, the top table 70 need not be inherently massive to achieve the rigidity necessary for the operation of the system. Instead, in the disclosed embodiment, the work table 70 is fabricated from a honeycomb core 71, sandwiched between respective upper and lower sheets 72 and 73, fabricated from stainless steel. The resulting structure 70 has a weight of 80 to 100 pounds, in contrast to the typical weights of 700 to 800 pounds for the cast iron work tables used in conventional drilling systems.

Figure 3:
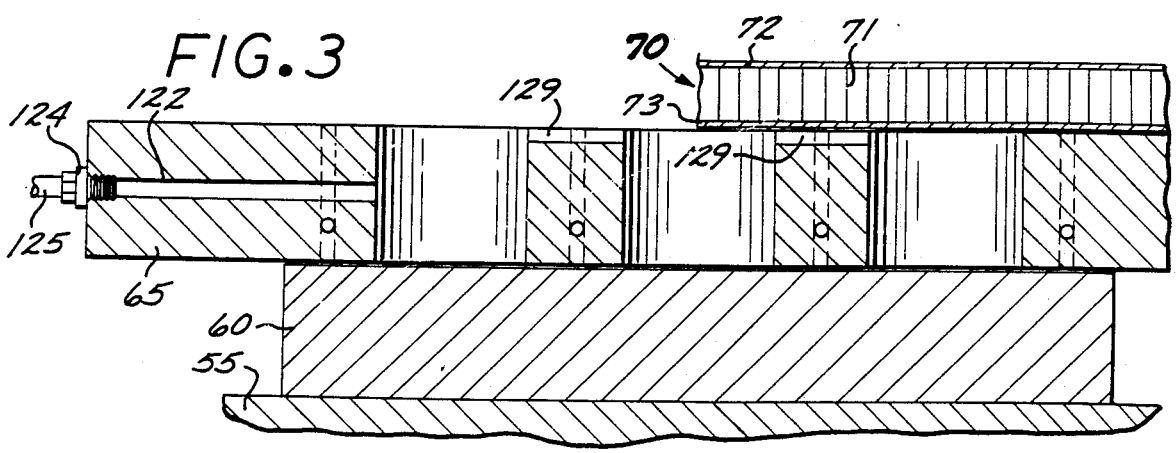
FIG. 3 is a partial cross-sectional frontal view of a portion of the machine of FIG. 1, taken along line 3—3 of FIG. 2.

FIG. 3 shows a cross-section of the work table 70. Several advantages flow from the use of the relatively lightweight table 70. These include lower cost of the table, and use of lighter elements to comprise the respective translating means for achieving the lateral positioning of the table in relation to the spindles during operation. Because the mass of the table has been dramatically reduced, the table may be moved much more rapidly and with less driving energy than required for conventional systems. As a result, the system uses less energy, may be fabricated at a lower cost, and operated at substantially higher speed. The higher speed results in increased throughout and higher productivity of the system.

FIG. 3 further illustrates the respective arrangement of the air bearings and the preloading means in relation to the guide beam 60, the crossbeam 65 and the top work table 70. The air bearings provide a lifting force, so that the table 70 floats on a cushion of air over the top surface of the crossbeam 65 (as depicted in FIG. 7), and the crossbeam 65 in turn floats on a cushion of air above the top surface of the guide beams 60 and 62. The vacuum preloading means provides vacuum preloading forces tending to draw the top table 70 and the guide beams 60 and 62 toward each other.

FIG. 4 further illustrates the preloading means and the air bearings between the beams and the work table. It is to be noted that the orifices for the air bearing and the vacuum chambers are carried by the same member, i.e., the crossbeam 65, to ensure a proper relation between the air bearing and the vacuum preloading means assuring that a vacuum chamber will never come into direct communication with an air bearing orifice. As illustrated in FIG. 4, pairs of orifices 120a and 120b are disposed in the upper and lower surfaces of the crossbeam 65, connected by bores 130 extending in the vertical (Z) direction. Horizontal bores 134 extend in the crossbeam 65 in communication with respective ones of the vertical bores 130 and with fittings 131 inserted in the exposed end of the bore 134 to provide a connection with the air supply hoses 132. The exposed ends of the vertical bores 130 are sealed with orifice fittings 135, best shown in FIG. 5, in which are formed the calibrated orifices 120a (top surface) and 120b (bottom surface). An exemplary fitting 135 is shown in the cross-sectional view of FIG. 6. The fitting 135 comprises a cylindrical insert member 135a having a counterbored opening 135b formed therein. A threaded plug 135c is threadingly received within the counterbore of insert 135a, with orifice 120a formed in the plug in communication with the opening 130. The air flow rate out of orifice 120a is dependent on the orifice size and the air pressure. In the disclosed embodiment, 0.006 inch diameter orifices and an air supply at 80 psi are employed.

FIG. 7 further illustrates the interface between the adjacent surfaces of the top table 70 crossbeam 65 and guide beam 60, with the arrows indicating the flow of air through the air bearing passages and out the orifices to lift the respective crossbeam 65 and table 70. The flow of air into a vacuum chamber is also depicted, and the resulting preload force indicated by the downwardly extending arrows against the upper surface of table 70.

Workpiece Hold-Down Apparatus

Referring now to FIGS. 8–10, a further aspect of the invention is illustrated. FIG. 9 is a cross-sectional view illustrating the workpiece hold-down apparatus 140 employed to secure the workpiece in a registered position at a typical workstation. The apparatus comprises a plenum 74 formed in work table 70, and the tooling plate 91, which is preferably fabricated from a relatively lightweight metal such as aluminum or a honeycomb structure, and which is disposed over the work table 70. A duct 141 is formed in the tooling plate 91 which is disposed on the table 70 with the duct 141 in communication with plenum 74. The plenum 74 is coupled to a source of vacuum (not shown).

Pins 142 and 143 are fitted in bores in the plate 95, and serve to register the position of other elements of the hold-down apparatus 140. These elements include a rectangular frame 145, a corrugated vacuum chuck fixture 49 and a workpiece backup board 136. One or more workpieces comprising the workpiece stack 137 are disposed on the backup board 136 for drilling by one of the spindle of the system.

The frame 145 is fabricated with the cross-sectional configuration illustrated in FIG. 9, with an upwardly extending side member 145a joined with the horizontal top member 145b. Resilient seals 147 and 148 are fitted respectively along the bottom surfaces of the side member 145a and the top member 145b. The seals are fabricated from a resilient material such as neophrene, and serve to seal against the vacuum which is drawn down within the sealed chamber 144 defined by the tooling plate 91, the board stack 137 and the frame 145. The vacuum chuck 149 comprises a plurality of channels 149a (best shown in FIG. 10) for distributing the vacuum over the chamber 144. To increase the system throughput, normally several printed circuits boards are stacked together to form the stack 37. The seals 147 and 148 have substantial compressible thicknesses, so as to accommodate varying thicknesses of the board stack 137, depending on the number of boards and their particular thickness.

The hold-down apparatus 140 operates in the following manner. With the tooling plate 91 installed on the table 70 and its position determined relative to the drilling spindles by conventional techniques, the vacuum chuck fixture 149 is disposed on the plate 91, with the pins 142 and 143 being received through bores formed in the fixture 149. The backup board 136 and the workpieces comprising the stack 137 are then placed on the fixture 149, with the pins 142 and 143 also fitting through corresponding openings formed therein to register the position of the workpieces on the work station. Next, the frame 145 is disposed over and surrounding the respective elements 149, 136 and 137 to define the vacuum chamber 144. It will be appreciated that the top surface of the stack 137 is subjected to the force of the atmospheric pressure, indicated by the arrows impinging on the exposed surface of the board stack 137 in FIG. 9. As the frame 145 settles in the position shown in FIG. 9, the air within the chamber 144 will be drawn down to a relative vacuum. The atmospheric pressure on the top of stack 137 will force the stack down, as well as drawing the frame 145 downwardly against the resiliency of the seals 147 and 148. The boards comprising the board stack are securely held in position by the atmospheric pressure. The drilling spindle carries out its sequence of drilling strokes to drill a predetermined hole pattern. The drill penetrates through the stack 137 into the backup board 136, but does not enter the vacuum chuck fixture 149, which would penetrate the vacuum chamber and permit air to enter the chamber. Thus, the vacuum in the chamber 144 is not relieved during the drilling strokes so that the boards remain securely fixed throughout the entire drilling sequence. This represents an improvement over known vacuum fixtures which employ the workpiece itself to define the vacuum chamber so that as holes are drilled in the workpiece the chamber is breached and air is admitted.

High Speed Drilling Spindle

One aspect of the invention is the provision of drilling spindles which are capable of very high sustained drilling speeds (80,000 to 120,000 revolutions per minute) and drilling rates or "hits" (on the order of 300 holes drilled per minute) using small diameter bits, e.g., 0.006 inches in diameter. FIG. 11 is an enlarged view of the spindle 81, an exemplary one of the high speed spindles 81-84 comprising the system 50 of FIG. 1. In accordance with the invention, the spindle comprises a stationary spindle body 156 mounted in the spindle housing 155 fastened to the upper support beam 80, and a spindle rotor 160 which is supported by air bearings within the spindle body 156 for very high rotational speeds and simultaneous rapid linear movements in the Z axis (along the rotor axis 161) to achieve the drilling strokes.

This arrangement contrasts with that of conventional drilling spindles, wherein the entire spindle is mounted for linear movement along the Z axis, and is driven by an external translating mechanism such as a leadscrew or a cam/rocker arm arrangement, and where linear motion is performed through guide bearings which are external to the spindle. The conventional spindle weighs on the order of 15 to 30 pounds, requiring a translating mechanism with suitable power capabilities to drive the weight of the entire spindle through the drilling strokes at the desired hit rates. The acceleration and deceleration of the entire spindle to achieve the drilling strokes results in substantial reaction forces on the entire drilling system, which tends to cause vibration in the system structure. Moreover, with the entire spindle translated through the drilling stroke, larger impact forces on the machine structure result, which in turn results in substantial Z axis vibration of the drill and workpiece. The Z axis vibration causes undesirable variations in the chip load on the fragile drill bits, introducing torsional stress and causing drill bit breakage.

By achieving the capability of translating only the spindle rotor, which may weigh only one pound, to achieve the drilling strokes, less power is required to drive the rotor through a drilling stroke, and the resultant impact force is substantially reduced, thereby also substantially reducing the z axis vibration. The acceleration/deceleration reaction forces on the system are also dramatically reduced. The reduction of such vibrations allows the use of the very small diameter drill bits and the high drilling rates and stroke rates described above.

The weight of the rotor 160 is supported by the counter-balancing springs 165 and 166, which attach to respective ends of rod member 168 and to respective ends of T-shaped support fixture 164, which is in turn mounted to the top of the spindle body cap 157. As will be described more fully below, the member 168 is coupled to the rotor 160, and translates up and down along the axis 161 with the rotor 160. Thus, the movement of member 168 along the axis 161 tracks the movement of the rotor 160.

The spindle 81 is provided with position and velocity feedback sensors 151 and 153 which provide respectively Z axis position and Z axis velocity information to the spindle control unit (FIG. 25). The position and velocity sensors 151 and 153 actually measure the relative position and the position rate of change of the member 168, which is directly related to the corresponding parameters for the rotor 160.

The position sensor 151, in the form of a potentiometer, comprises a wiper 152a, the upper end of which is secured to the member 168 and the lower end of which moves upwardly and downwardly within corresponding bore 152b formed in potentiometer body 152c containing a resistive element. Similarly, the velocity sensor 153 is in the form of a velocity transducer comprising a magnetic slider 154a, the upper end of which is secured to rod 168 and the lower end of which moves upwardly and downwardly within the bore 154b formed in the coil 154b. Such sensors are available commercially. For example, the position sensor may comprise the T50A502 model sensor marketed by Sieb & Meyer GMBH, West Germany, and the velocity sensor may comprise the 0111-0000 model sensor marketed by Trans Tek.

The construction of the spindle 81 is shown in further detail in the cross-sectional view of FIG. 12. The spindle comprises elongated cylindrical rotor shaft 160, which includes a thrust flange 170 at the upper end 160a of the rotor 160. A thrust bearing 172 captures the flange 170 and couples the rotor to sliding plunger 174.

The plunger 174 comprises a cylindrical hollow member having a substantially closed lower end 174a. The plunger 174 slides within the hollow cylindrical opening defined by the tubular insert member 175 with its liner 177, comprising an anti-seize surface, for example, Teflon-impregnated bronze, which in turn is fitted within the spindle body 156. The insert member 175 includes the air bearing passage 175a, which communicates with bore 157 formed through the spindle body 156. An air fitting 158 is secured in the bore 157, and an air line 159 attached thereto is connected to a pressurized air source (not shown). A groove is formed in the outer periphery of the insert member 175 to define a circumferential input air plenum 179a. Passages 179b are formed in the insert member 175 and liner 177 between the plenum 179a and the inner periphery of the liner 177, thereby allowing air to flow between the plenum 179a and the annular opening between the rotor and the liner 177. A plurality of the passages 179b are distributed radially about the axis 161 to provide a distributed air supply into the annular opening.

The plunger 174 has formed therein an air passage 176 which extends from the region adjacent the air plenum 175b defined by the insert member 175 liner 177 down into the lower end 174a, where the passage communicates with corresponding passages formed in the thrust bearing 172.

The thrust bearing 172 is shown in further detail in the enlarged partially broken-away, cross-sectional view of FIG. 21. The bearing 172 comprises three circular elements 172a, 172b, and 172c secured to each other and to the plunger 174 by six conventional fasteners 172f. The multi-element construction of the thrust bearing 172 allows the assembly of the bearing about the flange 170 of the rotor 160. Element 172a is first assembled to the end 174a of the plunger 174. Next, the center element 172b, comprising a ring-like structure, is assembled to the element 172a. With the flange 170 inserted into the recess defined by the upper element 172a and the center ring-like element 172b, the lower element 172, also a ring-like structure may be slipped around the rotor shaft 160 and assembled to the exposed lower annular surface of the center element 172b. The entire thrust bearing assembly may then be secured by the fastener 172f to the plunger 174.

Each of the elements comprising the thrust bearing 172 includes air passages which communicate with the air passage 174a formed in the plunger 174 to form an air passage network supplying the pressurized air supporting the flange 170 within the thrust bearing. Thus, the upper element 172a includes six passage orifices 172d (two of which are visible in FIG. 21) which distribute pressurized air about the top peripheral surface of the flange 170. Lower element 172c includes six passage orifices 172e (one is visible in FIG. 21.) which distribute pressurized air about the lower peripheral surface of the flange 170. The center element 172b includes connecting passages to connect corresponding aligned passages formed in the upper and lower elements 172a and 172c. The direction of the air flow is indicated by the arrows shown in FIG. 21.

The purpose of the air line 159 and the various air passages formed in the body 156, the insert 175, the plunger 174 and the thrust bearing 172 is to provide an air bearing facilitating the sliding of the plunger 174 within the insert member 175, and the rotation of the flange 170 and rotor 160 relative to the (rotationally stationary) thrust bearing member 172. As will be described more fully below, the rotor and plunger translate axially during operation along the extent of a range of movement, while the rotor 160 is simultaneously rotating at high speeds relative to the plunger 174. The pressurized air is admitted through bore 157 into passage 175a, and provides a separating air cushion or bearing in the narrow annular region between the liner 177 and the plunger 174, substantially reducing any sliding friction between the two members. Additionally, the pressurized air flows through the plenum 175b into passage 176 in the plunger 174, and is conducted through the passages in the thrust bearing elements and out the orifices 172d and 172e. Thus, an air bearing is formed to separate the adjacent surfaces of the rotor flange 170 and the thrust bearing member 172.

The upper end of the plunger 174 is secured to member 168. Cylindrical rod members 168a and 168b comprising member 168 extend through slots 180 and 181 formed in the upper end of the spindle body 156 and extend parallel to the vertical axis 161 of the spindle. Ball bearing race 182 is fitted to the rod member 168a to substantially reduce any frictional drag on member 168a caused by contact with a wall of slot 180. Thus, the rod member 168a, race 182 and slot 180 cooperatively form an anti-rotation bearing preventing rotation of the plunger 174 while permitting linear travel of the plunger along axis 161.

The upper and lower ends 160a and 160b of the rotor 160 are also supported by rotary air bearings within spindle body 156 to allow virtually frictionless rotation about the axis 161. The lower spindle housing 155 comprises a bore formed therein for receiving the spindle body 156. Upper tubular insert member 185a having an inner liner 183a is fitted within the body 156. The insert member 185a with its liner 183a encircles the rotor at its upper end 160a, and is adapted to support the rotor end within a relatively small tolerance between the outer rotor periphery and the inner periphery of the liner 183a. The liner 183a comprises the anti-seize compound lining its inner surface which surrounds the rotor. The purpose of the liner is to prevent damage to the rotor and the insert member 185a in the event the air bearing supply is terminated while the rotor is still rotating at high speed. Without an anti-seize lining, the heat resulting from the friction between the rotor and the adjacent liner or insert surfaces could result in welding of the rotor to those surfaces.

A groove is formed in the outer periphery of the insert member 185a to define a circumferential input air plenum 186a. Passages 187a are formed in the insert member 185a and liner 183a between the plenum 186a and the inner periphery of the insert member, thereby allowing air to flow from the plenum 186a into the annular opening between the rotor and the insert. A plurality of the passage 187a are radially distributed about the axis 161 to provide a distributed air supply into the annular opening. A bore 188a is formed through the body 156 and the spindle housing 155. Air line 190a is connected to the fitting 189a inserted in the bore 188a, and to a pressurized air source (not shown). O ring pairs 191a and 192a provide an air seal between the housing 155 and the body 156, and between the body 156 and the insert member 185a.

In a similar fashion, the lower end 160b of the rotor 160 is supported within the spindle body 156 for rotation on a circular air bearing. Lower tubular insert member 185b with liner 183b is fitted within the lower end 156a of the spindle body 156, and is secured in position by a threaded fastener 193. A plurality of passages 187b are formed in the insert member 185b and liner 183b between the circumferential plenum 186b and the inner periphery of the liner 183b. A bore 188b is formed through the spindle housing 155 and the body 156. Air line 190b is connected between the fitting 189b mounted in the bore 188b and the source of pressurized air.

The spindle rotor 160 is driven by a rotary drive motor. The stator of the drive motor is disposed within the spindle body 156 intermediate to the upper and lower insert members 185a and 185b. The stator comprises a laminated iron core 195 and a plurality of copper wire windings 196 which are wound around a corresponding number of axial slots formed in the core 195. Wires 197 couple the respective stator windings 196 to a frequency converter for driving the motor.

The rotor 160 of the disclosed embodiment comprises a solid cylinder shaft of tool steel, 0.625 inches in diameter and 5.3 inches in length, with a weight of about one pound. The rotor 160 further comprises a plurality of elongated copper bars 198 which are inlaid in axial slots at the outer periphery and which are all connected at each end by copper rings embedded in the shaft outer periphery, to conduct the rotor electrical currents and thereby permit the electromotive force to be exerted on the rotor by the stator during drive motor operation. In accordance with another aspect of the invention, the bars 198 are disposed along the rotor shaft so as to overlap the extent of the stator by a length at least equal to the maximum axial travel of the rotor. The overlap is split between the upper and lower ends of the stator elements. For example, in the disclosed embodiment the windings 196 have a lengthwise extent of 1.08 inches, and the bars have a corresponding lengthwise extent of 1.71 inches allowing a total travel of 0.62 inches. The actual dimensions may, of course, be varied to provide a travel length necessary for the particular application. With the added length of the bars, the rotor may be axially translated along the allowed range of movement without the loss of any magnetic flux by the motor magnetic circuit, so that a substantially constant electromotive force is applied to the rotor by the drive motor throughout its range of axial movement. This results in a substantially constant rotation speed irrespective of the rotor axial position within its range of movement.

The drive motor comprising the rotor 161, the stator windings 196 and the core 195 is an ac variable frequency brushless motor. Drive signals are applied to the stator windings via wires 197 from a frequency converter. In this embodiment, the frequency of the drive signal is variably selected to provide the desired rotational speed. For example, using a 21.35.1 model frequency converter marketed by Sieb & Meyer GMBH, West Germany to drive the windings 196, a drive signal frequency of 1000 cycles per second results in a rotor speed of 60,000 rpm, while a drive signal of 2,000 cycles per second results in a rotor speed of 120,000 rpms. For the disclosed embodiment, the motor is power rated at 120 watts. The design of ac brushless motors is well known, and the precise details of the stator windings, the core layout and the motor driver need not be described in further detail, as it is well within the purview of one of ordinary skill in the art to provide a motor for achieving the motor requirements for a particular application.

The spindle 81 further comprises an active coolant system for cooling the spindle in the region of the ac brushless motor. The coolant system comprises an inlet passage 200 and the circumferential inlet plenum 202 formed in the housing 155 around the body 156 adjacent an upper portion of the windings 196. The inlet plenum 202 is in communication with the passage 200, and also with the outlet plenum 203 though openings (not shown) formed in the common dividing wall 202a. Plenum 203 is formed in the housing 155 around the body 156 in the region adjacent a lower portion of the stator windings 196.

Figure 26:
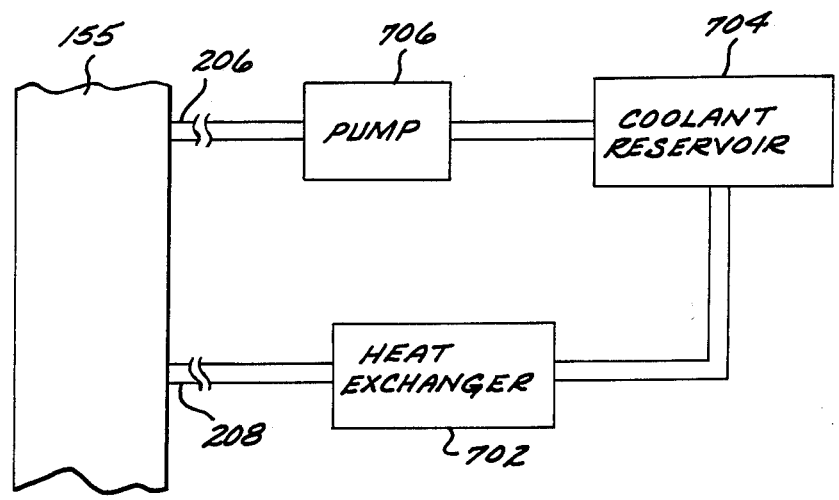
FIG. 26 is a simplified schematic block diagram of the spindle coolant system.

Outlet passage 204 is formed in the housing 155 in communication with the outlet plenum 203 to exhaust the coolant out of the outlet plenum. An inlet line 206 is coupled to inlet passage 200 by fitting 205, and is connected to a coolant pump 706 (FIG. 26). Water is suitable for use as the coolant fluid.

A coolant outlet line 208 is coupled to passage 206 by fitting 207, and is connected to a heat exchanger 702 (FIG. 26) and then to a coolant reservoir 704. The cooling system is preferably a closed system, wherein the coolant is recirculated from the reservoir 704 back to the pump, to be pumped back into the spindle housing 155. Thus, in operation the coolant flows into the passage 200 and then into the inlet plenum 202 and the outlet plenum 203, where heat is absorbed from the spindle body. The heated coolant fluid is then exhausted from the outlet plenum through the passage 204. The flow of coolant through the system is preferably continuous to maintain a steady state operating temperature.

The spindle 81 further comprises a linear motor which drives the rotor 160 along its axis to perform the drilling motions. The motor is adapted to provide axially directed forces on the rotor about five pounds in magnitude, tending to drive the plunger 174 and the rotor 160 downwardly in the Z axis direction to feed the drill tool into the workpiece positioned below the drilling spindle, or upwardly to lift the rotor and drill tool away from the workpiece. The counterbalancing springs bias the rotor to the centered rest position depicted in FIG. 12, and serve to counteract the force of gravity so that the rotor weight is transparent to the linear motor operation. Thus, the motor is not required to exert more force to raise the rotor than to lower it.

The linear motor comprises a moving coil assembly 210 acting in cooperation with a permanent magnet and flux connector assembly 220. The moving coil assembly 210 comprises a bottom flange member 211 which is fastened by a fastener 211a screw to the top of member 168, and a thin hollow metal spool 212 connected to the flange. Insulated copper wire is wound around the outside of the spool from the bottom to the top of the spool and then back down to the spool bottom to form the coil 213. The ends 214 of the wire forming the coil are brought down and secured to the top of rod 168b and connected to a linear motor driver to provide the motor drive signals. The drive signal is a pulse width modulated, four quadrant closed loop signal whose voltage is proportional to the load. The motor is adapted for a 70% duty cycle and to provide maximum stroke excursions of ±0.375 inches, with feed rates ranging from one inch per minute up to 1000 inches per minute.

The permanent magnet and flux connector assembly 220 comprises the annular permanent magnet assembly 222 which fits around the inner periphery of the flux connector 224. The connector 224 is preferably fabricated from high permeability steel and comprises a hollow outer cylinder 224a and a solid inner cylinder 224b. The outer cylinder fits around the outer periphery of the moving coil assembly 210, and the inner cylinder 224b is adapted to be inserted within the hollow metal cylinder 212 comprising the coil assembly 210. The outer and inner cylinder members of the flux connector are connected by the top plate 224c to complete the magnetic path.

The spindle cap member 157 fits over the flux connector 224, and is secured to the spindle body 156 by engagement of mating threads.

The spindle 81 further comprises a sensor 178 mounted to the plunger 174 for sensing the rotations of the rotor 160 and providing a signal on line 179 indicative of its rotational speed (rpms) of the rotor 160. The sensor may comprise a magnetic sensor such as the model 3080 magnetic sensor, marketed by Electro Corporation, Newport Beach, California.

The spindle control unit receives the rpm indication signals, the Z axis position signals and the Z axis velocity signals from the respective sensors 178, 152 and 154. The rpm signals are employed to control the ac brushless motor excitation signals to provide the desired rotation speed. The position and velocity signals are processed by the spindle control unit to control the linear motor to provide the desired rotor axial position and velocity.

High Leverage Centrifugal Chuck

The spindle 81 comprises a novel centrifugal chuck assembly 250, disclosed in detail in FIGS. 13 and 14. The assembly elements are disposed within the axial bore 162 formed in the lower end 160b of the rotor shaft. The elements include a tool alignment bushing 251 fitted into the end of the bore 162 in alignment with the rotor shaft axis 161, unitary high leverage centrifugal chuck 255, chuck alignment bushing 265, and chuck retainer 270. As depicted in FIGS. 12 and 13, the shank of the drill bit 400 is inserted into the chuck, and its upper end received within the hollow alignment bushing 251. The shank is gripped securely by the chuck 255 during high speed rotation of the rotor, as will be described in further detail.

The chuck 255 is shown in perspective in FIG. 14, and comprises four elongated lever arm members 256a–d, all connected to the upper portion of fulcrum region 257 (see FIG. 13). The lever arms are arranged in two pairs of diametrically opposed levers, 256a, 256c and 256b, 256d. Four corresponding gripping jaws 258a–d are connected to the lower portion of region 257. The jaws are also arranged in corresponding diametrically arranged pairs, 258a, 285c and 258b, 258d.

The chuck 255 may be machined from a block of tool steel or other high tensile strength, springy material. The exterior shaping of the chuck, with its larger diameter upper end tapering to a central region of intermediate diameter, the central region in turn tapering to a relatively small diameter at its lower end, may be provided by turning the block workpiece on a lathe. The counterbored shank opening 259 may then be bored into the chuck. The four respective lever arm and jaw members may then be defined by performing a cutting or sawing operation along four lines running parallel to the chuck axis and disposed at 90° spacings to form the open regions between the respective arms and the respective jaws. After the cutting operation, the only connection between the jaws and lever arms is provided by the connective fulcrum ring region 257 (FIG. 13).

It will be appreciated that the chuck 255 need not be fabricated as a unitary element, but could instead comprise separate lever arm elements joined in a pivoted assembly, for example.

In FIG. 13, the diametrically opposed pair of lever arm members 256b and 256d are shown. The corresponding jaw members 258b and 258d are connected to the respective lever arm members by fulcrum region 257. The region 257 forms a solid ring region surrounding the shank opening formed in the chuck, providing a means for connecting the respective jaw and lever arm members to form the chuck 255.

It will be appreciated that the lever arm 256b, viewed as extending substantially parallel to the rotor axis from the center connective region 257 by a distance L, has a center of mass depicted at point A and located a distance $L_a$ from the center of region 257. Similarly, the exemplary jaw member 258b has a center of mass, again in relation to the center of region 257, depicted at point B. The chuck 255 in the disclosed embodiment is dimensioned such that the relative distances $L_a$ is about five times the length of $L_b$.

The chuck 255 is disposed into the bore 162 in rotor 160 and secured in place by the bushing 265. A chuck retainer 270 is threaded into the end of the rotor to secure the chuck assembly in place.

The bushing 265 comprises a protruding rim member 265a which seats against the shoulder 163 defined at the lower end of the rotor, thereby registering the bushing position. The bushing 265 includes a central bore 267 formed therethrough to receive the shank of the drill bit 300. The upper end of the bushing 265 has formed therein a larger bore 268 which accepts the intermediate region of the chuck 255. The upper end of the bushing 265 is chamfered to provide a tapered surface 269 so as to clear the tapered region 261 of the chuck 255. A shoulder 266 is formed in the bushing, providing a stop surface for the shoulder 263 of the chuck 255.

The chuck bushing 265 is seated within bore 162 in axial alignment with the rotor shaft. The bit 400 is therefore aligned with the axis of the rotor by the cooperative engagement of the bit shank in the bushing 251, with the chuck jaws 258a–d and the inner periphery of the bore 267 formed in the chuck bushing 265. This cooperative engagement serves to minimize the bit runout during operation.

The centrifugal chuck 255 acts as a passive chuck, with chuck gripping forces being derived primarily by the centrifugal forces created during high speed rotation of the rotor shaft 160. O-ring 263a is disposed around the alignment bushing 251 at the upper ends of the chuck lever arms 256a–d, urging them outwardly away from the rotor shaft. The lever arms 256a–d rotate around the fulcrum region 257 of the chuck 255, causing the respective jaws 258a–d to pivot inwardly to grip the shank of the bit. Since the four jaws comprise diametrically opposed jaw pairs which are uniformly spaced around the bit periphery, the bit will be gripped by all four jaws 258a–d in a circularly symmetrical manner. A split ring 263b is disposed in a circular recess formed in the chuck 255, and frictionally engages the periphery of the inserted bit shank, with enough force to retain the bit shank with the chuck in the static (non-rotating) condition. The O-ring 263a and spring 263b provide a slight gripping force sufficient to retain the bit shank in the inserted position shown in FIG. 13 while the rotor is not spinning at high speed.

The lever arms 256a–b serve to magnify the centrifugal forces resulting from high rotor speeds to provide very substantial jaw gripping forces. The relative dimensions of the jaws and lever arms are cooperatively selected so that as the rotor spins, the weight of lever arms results in an outwardly directed force, as indicated by the arrows shown in FIG. 13. In the disclosed embodiment, with the center of mass of the lever arms located at a distance from the fulcrum region which is five times the distance of the center of mass of the jaws from the fulcrum, the centrifugal forces are magnified by a factor of five and exerted against the bit shank. In this embodiment, the gripping force exerted by the centrifugal chuck action through a single jaw on the drill shank is equal to 900 pounds with the chuck rotating at 120,000 rpm. The tremendous gripping forces ensures that the drill bit will be securely and concentrically gripped during operation. With the passive chuck arrangement described above, the bit is very securely held while the rotor is at high rpms, when high gripping forces are needed, and is only loosely held while the rotor is not rotating. Other advantages of the chuck assembly are the automatic alignment of the bit with the axis of the rotor, thereby minimizing the bit runout, and the ready removal of the bit to change drilling tools.

The Tool Changer

Referring now to FIG. 15, a top view of exemplary tool changer 95 is shown. The device 95 includes a top plate 305 mounted for sliding movement along an axis parallel to the Y axis (FIG. 2). The device 95 further includes left and right side members 307 and 310, and end member 312 (more clearly shown in FIG. 16). The position of the plate 305 in the Z axis direction is maintained by screws 315 extending from above the plate 305 through the elongated slots 317 formed in the top plate to a structural member 321 comprising the tool changer 95 (see FIG. 17). Thus, the screws 315 allow sliding movement of the plate 305 along the extents of the slots 317.

A piston 325 driven by a pneumatic cylinder (not shown) actuates slider 328 having a rectangular cross-section and fitted within a slot 330 having a corresponding rectangular cross-section beneath the top plate 305. A pair of upwardly extending pins 332 and 334 are attached to the slider 328, and extend through slots 336 and 338, respectively, formed in the top plate 305. These slots 336 and 338 are angularly offset from the X axis direction, so that as the slider 328 is translated back and forth along an axis parallel to the Y axis indicated by arrow 340, the pins 332 and 334 impart a force to the top plate 305 tending to move the plate 305 along an axis parallel to the Y axis. In the disclosed embodiment, the slots are arranged at an angle of about 30 degrees with respect to the X axis, although the exact angular offset is a matter of design choice.

The tool changer 95 includes a plurality of magazines for accepting clips carrying the drilling tools or bits. By utilizing clips which have been preloaded with the bits, operator handling of individual bits is eliminated, thereby eliminating one primary cause of bit breakage.

The respective clips are inserted into each magazine along a respective one of the elongated slots 347 defined in the top plate 305. An exemplary clip 350 is depicted in the fully inserted position in the cross-sectional view of FIG. 16. The clip 350 comprises an elongated body having a plurality of openings 352 formed therein in an aligned relationship for receiving the bits 400. The respective magazine is defined by the upper surface of the bottom member 320 of the device 95, the structural members 321, the end member 312 and the top plate 305. The clip is fed into the magazine from the end 251 until the inserted end of the clip abuts the spring-loaded plunger 342. The clip is retained against the spring 344 bias by the key 345, which is in turn spring-loaded by spring 346 against the bottom surface of the clip 350. A notch 354 is provided in the clip bottom surface to provide a stop shoulder against which the end of the key lodges. To remove the clip 350, the system operator manually lifts the outer key end thereby releasing the clip to move out of the magazine as a result of the bias of the spring 344.

An important feature of the tool changer 95 is the provision of a means for locking and unlocking the bits in the tool changer, thereby preventing the bits from being removed or dislodged from the clips unless the access means is unlocked, while accommodating the loading of clips holding the bits. The locking and unlocking means employs the cooperation of the clip 350, the bit configuration, and the top plate 305. As shown in FIGS. 16 and 17, a collar 402 is fitted around each bit and comprises a groove 403 formed in the outer periphery of the collar. The clip 350 comprises a body having an upper surface 356, in which a plurality of aligned apertures 352 are formed. Each aperture is counterbored to partially receive the collar 402 of a drill tool or bit 400. The bit is disposed in a clip aperture with the collar 403 partially inserted into the counterbored aperture. The remaining portion of the collar, including the groove, extends above the top of the surface 357. As the clip is inserted into the magazine, the groove 403 in each bit collar 402 receives the edge of the elongated slot 347 formed in the top of the plate 305. The width of each slot is selected such that the slot is just wider than the diameter of the collar 402 at the groove interior. Thus, with the bits 400 aligned along the longitudinal extent of the clip 350, the collars 402 slide along the slot 347 and are captured by the slot edges 348.

Each slot 347 comprises six enlarged clearance openings 349 defined therein, each opening corresponding to a particular one of the six bits 400 in the clip 350. In the locked position, the top plate 305 is aligned such that the collars 402 of the bits 400 are captured by the slot edges 348 at the narrowed regions of the slot. The locked position is illustrated in FIG. 15. The unlocked position of the plate 305 corresponds to the plate position wherein the clearance openings 347 are aligned with the axis of the corresponding bit in the clip. In this position, the collars 402 are no longer captured by the edges 348 of the slots, and the bits are then free to be lifted out of the clip and the tool changer.

To achieve the unlocked position, the slider 328 is translated to move the pins 332 and 334 from the position shown in FIG. 15 to the other end of slots 336 and 338 in the direction of arrow 340 in FIG. 15. This translating movement results in a force pushing the plate 305 in the direction of arrow 341 in FIG. 15. This force slides the plate in the +Y direction with the length of the slots 336 and 338 being precisely determined to provide the appropriate travel to align the respective axis of the enlarged openings 349 with the respective bit axis.

The tool changers are each mounted for movement along the Z axis, to load and unload the bits 400 into the respective drilling spindles. Thus, the toolchanger 95 may be raised or lowered along the Z axis by a pneumatic cylinder arrangement, comprising cylinder 380 carried by plate 382 secured to the top table 70 (not shown in FIG. 16) Piston 384 is actuated by the cylinder 380. The end of the piston is secured to mounting plate 385, secured to the lower member 320 of the tool changer. By operation of the pneumatic cylinder in a manner which is well known to those skilled in the art, the tool changer 95 may be raised or lowered to accomplish the tool changing functions to be described in further detail hereinbelow.

Tool Bit and Clip Configuration

Another aspect of the invention is represented by the tool clip and bit configuration shown in the cross-sectional view of FIG. 18. The cover 360 is adapted to protect the bits 400 in the clip and to secure their position during shipment or storage. The clip cover 360 includes a pair of inwardly extending ribs 362 which are adapted to capture the bit collar at the groove 403 defined in the outer periphery of the collar. The cover 360 further comprises a pair of downwardly extending ears which engage about a corresponding pair of shoulders 358 defined by the grooves 359 in the side of the clip body 350. Thus, the cover 360 is secured in position of the clip body by the engagement of the ears with the shoulders, nd the ribs of the cover engage the collar to capture the bit in the clip. Prior to loading the clips 360 into the respective magazines of the tool changer, the clip covers 360 are removed.

Referring now to FIGS. 19 and 20, an alternative embodiment of the tool and a corresponding clip configuration are disclosed. The bit 410 comprises a groove 415 defined in the shank of the bit. The cutting end of the bit transitions to a stop shoulder 417 defined in the bit shank. The clip 420 is adapted to store drill bits having the configuration of the bit 410. In this configuration, the ribs 426 of the clip cover 424 are extended to be received within the groove 415 formed in the bit shank so as to capture the bit 410. The clip body includes a bore 421 for receiving the cutting end of the bit 410, and a stop shoulder 422 formed by counterboring the aperture 421 and defining a shoulder surface 422 adapted to provide a stop surface for engage the corresponding shoulder 417 of the bit 410. Thus, the depth of insertion of the bit 410 into the body of the clip is controlled by the depth of the counterbore of opening 421 and the relative location of the shoulder 417.

The tool configuration shown in FIG. 19 may be employed in tool changers of the type shown in FIG. 15. To accommodate the alternate clip and bit embodiment, the width of each slot 347 is narrowed so that the grooves 415 in the bit shanks are captured by the edges 348 of the slots 347. To operate with the tool configuration of FIG. 19, the chuck assembly 250 is provided with an adjustable set screw 430, fitted into the alignment bushing 251, to prevent drill slippage into the chuck assembly during tool change operations when only static forces are gripping the tool shank.

System Operation

Referring now to FIG. 25, a system level block diagram of the control system is disclosed. The system comprises a system control unit 505 for providing overall control of the various components of the system. In this embodiment, the controller 505 comprises a commercially available unit, the model 35 controller marketed by Sieb & Meyer, GMBH, West Germany. The controller 505 comprises in this embodiment a display, operator controls, a keyboard for receiving operator instructions, paper tape reader for inputting a program, a spindle select control for direct manual selection and control over the drilling spindles, and a paper punch for providing a hard copy of a program, in addition to a computer. The particular requirements of a given application will dictate to some extent the necessary elements of the controller 505.

The system control unit 505 is coupled to the remaining elements of the system by the interface unit 510. Thus, the interface unit 510 is connected to the X and Y linear scales 66 and 67, to the X axis and Y axis servo motor amplifiers 512 and 516, and to the respective toolchangers 95–98. This provides the capability of the controller 505 controlling the operation of the servo motors 102 and 112 to position the crossbeam 65 and work table 70 precisely. Servo motor tachometer units 514 and 518 provide feedback of the respective shaft positions of the motors 102 and 112, and the linear scales 66 and 67 provide signals indicative of the positions of the crossbeam 65 and table 70.

The spindle control unit 525 is also coupled to the system control unit through the interface unit 510. The spindle control unit comprises the frequency converters needed to drive the rotary motors of the spindles, and the amplifiers needed to drive the linear motors. The spindle control unit 525 is coupled to the spindles 81–84 and 85–89 to control the various functions carried out by the drilling spindles.

The spindle position and velocity sensors are indicated by FIG. 25 by the reference letters "P" and "V." The rotary drive motors are indicated generally by the reference letters "SM," and the Z axis translating means (such as the linear motor for the high speed spindles 82–84) are indicated generally by the reference "M." The sensor for indicating the rotational speed of the spindle rotor is indicated generally by the reference "R."

As indicated schematically in FIG. 25, the spindle control unit 525 provides the drive signals to the various spindle motors, and receives position, velocity and rotational speed information from the various sensors to control the high speed spindles 81–84 in the desired manner. The conventional spindles 85–89 are also controlled by the spindle control unit 525, and position and velocity information is also fed back to the unit 525 for these spindles as well.

The operation of the high speed drilling system described above is controlled by the system control unit. The particular drilling sequence to be performed on a particular workpiece is predetermined and the particular sequences to be carried out are embodied in instructions which are programmed for implementation during operation. Thus, the controller instructs the translating means to position the respective workpieces under the respective spindles to commence the first drilling bit. The control unit 505 is programmed with appropriate instructions to direct the spindle control unit to operate the rotary motor driver and the linear motor driver to rotate the rotor shaft and the shaft to be translated downwardly to drill the hole in the workpieces. To increase the system throughput, a plurality of workpieces will be stacked under each drilling station to be drilled simultaneously. The various elements of the system cooperate to allow the system to sustain hit rates of 300 per minute when drilling very small diameter holes for the high speed spindles described above.

The system (shown in FIG. 25) that controls the motion of the drilling spindle is an interrelated series of electrical circuits that control the velocity and the excursion positions of the mechanism. The linear potentiometer or position transducer (P) associated with the spindle movement provides the feedback to the electrical circuits and thereby is capable of being controlled to computer-generated position requirements. The linear velocity transducer (V) provides a feedback signal that is indicative of the instantaneous velocity of the mechanism. The spindle control unit compares the feedback velocity actual to the computer-requested velocity. The result of this comparison is to produce a velocity that is equal to the requested velocity. Should any disturbance occur in which either the position or velocity is not equal to the requested values, the spindle control unit responds with corrective amounts of drive to the spindle actuator (motor) to bring the error to null.

The system is prepared for operation by placing the workpieces on the tool plates and securing their position by the vacuum hold-down apparatus described above. The appropriate tool clips having the drill bits which will be used during the drilling operation on the particular workpieces are loaded into the tool changer magazines. The mix of bit sizes will typically include the small diameter bits for the high speed spindles as well as larger diameter bits for conventional drill spindles.

To load the spindles with a desired tool, the X and Y translating motors are operated to position the desired one of the spindles for a drilling station over the tool changer for the station. The spindle is positioned directly over the particular drill bit to be loaded. With the top plate of the tool changer in the locked position, the Z axis pneumatic cylinder for the tool changer is actuated to raise the tool changer upwardly, inserting the shank of the bit into the chuck of the spindle. The top plate of the tool changer is then moved to the unlocked position, releasing the bits in the tool changer. The Z axis cylinder is then actuated to lower the changer with the bit held in the spindle chuck. With the tool changer lowered to a level beneath the work table, the drilling sequence employing the loaded bit is then carried out.

The tool changer may be repeatedly accessed to change tools as required to complete the drilling sequence on the workpiece. To unload a bit, the loading sequence is simply reversed.

The invention is not limited to the use of only two spindles per work station. As indicated in FIG. 1, a number of spindles may be employed at each work station and may even be operated simultaneously if the particular drilling sequence permits, i.e., with repetitive sequences.

In some applications which result in substantial quantities of debris from the drilling operations, it may be advantageous to employ the alternate embodiment of the crossbeam depicted in FIG. 22-24. It is difficult to grind and maintain a sharp edge on the granite crossbeam due to the brittleness of granite, and grit or other debris on the guide beams can be swedged between the granite surfaces of the guide beams and the crossbeam, thereby contaminating the air bearing. The alternative embodiment of of the crossbeam solves this problem. In this embodiment, the one piece granite crossbeam 65 of FIG. 1 is replaced by a crossbeam assembly 600, comprising two pairs of aluminum lower transverse beams 605, 610 and 615, 620, and a pair of granite crossbeam members 625 and 630. The use of the aluminum transverse beams provides a means of readily providing a structure having very sharp corners, thereby tending to prevent debris particles from becoming swedged between the upper granite surface of the guide beams and the bottom surfaces of the aluminum beams.

One pair of the aluminum transverse beams 605, 610 is shown in the cross-sectional view of FIG. 23. Each transverse beam includes two vacuum chamber openings extending through the beam thickness, and a plurality of air bearing orifices opening from the lower surface thereof. Communicating passages are formed within the transverse beams to supply pressurized air to the orifices. Only vacuum chambers 605 and 611 and orifices 607 are visible in FIG. 23. One pair of transverse beams 605, 610 is situated for translation above the guide beam 60, and the second pair of transverse beams 615, 620 is situated for translation above the second guide beam 62.

FIG. 24 is a side cross-sectional view showing the manner in which the transverse beams fit together with the granite crossbeam members 625 and 630. As shown in this view, the transverse beam 620 comprises lower planar regions 621a, 621b which are supported above the guide beam 62 by the air bearing created by the air supplied from orifices 624. The sharp corners 623a and 623b serve to prevent debris from being swedged between the upper surfaces of the granite guide beam 60 and 62 and the planar regions 621a and 621b of the transverse beams. The upper surface of the transverse beam 620 includes relieved areas into which the granite crossbeam members 625 and 630 are fitted. The transverse beam 620 comprises two vacuum chambers 622a and 622b, air passages 624a and orifices 624b fitted into the passages. The air passages are coupled to a source of pressurized air (not shown).

The crossbeam members 625 and 630 each comprise two pairs of vacuum chambers, one pair situated above and communication with the corresponding vacuum chambers formed in the respective transverse beams. Each chamber extends through the thickness of the crossbeam. A slot is formed in the upper surface of the crossbeam to extend between the vacuum chambers of each pair to form an elongated vacuum chuck. The respective pairs of vacuum chambers and elongated slots provide a powerful preload force tending to draw the top table 70 and the guide beams 60 and 62 together.

Each of the crossbeams 625 and 630 are also provided with air bearing orifices and connecting passages to supply pressurized air to support the table 70 above the beams 625 and 630 in the same manner as described above for crossbeam 65.

Thus, the beam member 625 shown in FIG. 23 comprises vacuum chambers 626 and 627 respectively aligned with chamber 606 in transverse beam 605 and chamber 611 formed in transverse beam 610. Orifices 628b are fitted in passages 628a to provide an upper air bearing supporting the work table 70.

The alternate crossbeam assembly depicted in FIGS. 22-24 provides several advantages. The assembly comprising the two pairs of aluminum transverse beams and the two crossbeam members is substantially lighter in weight than the one-piece granite crossbeam 65 of FIG. 1. Sharp corners may be readily formed at the lower sliding surfaces of the aluminum transverse beams, tending to prevent debris particles from being swedged between the guide beams and crossbeam sliding surfaces and thereby contaminating the air bearing between the two surfaces.

For example, the preloading of the wok table in opposition to the air bearing lift forces may be employed in split-axis machine tool systems, in which the work table is translated along one axis (e.g., the X axis) and the tool head such as a drilling spindle is mounted for translation along a second axis (e.g., the Y axis). In a split axis drilling system the drilling head is also conventionally mounted for translation along the Z axis to feed the drill tool into and out of the workpiece. Thus, in such a split axis system a preloading force may be applied between the work table and its guide beam. A second preload force could be applied to oppose the bearing allowing spindle or tool head translation along the Y axis. While the invention has been described in the context of a high speed drilling system, it will be apparent that many aspects of the invention are not limited to drilling systems per se, but may be employed in other machine tool applications. These aspects include, by way of example only, the positioning system and the vacuum hold-down apparatus.

It is understood that the above-described embodiment is merely illustrative of the many possible specific embodiments which can represent principles of the present invention. Numerous and varied other arrangements can readily be devised in accordance with these principles by those skilled in the art without departing from the spirit and scope of the invention.

What is claimed is:

1. A high speed drilling spindle for a drilling system, comprising:
    a fixed spindle body;
    a rotatable rotor shaft supported within said spindle body for high speed rotation and linear translation along a rotor shaft axis;
    a chuck assembly for securing a drilling tool at the lower end of the rotor shaft in alignment with the shaft axis;
    a rotary air bearing means for supporting the rotor shaft for high speed rotation with low frictional drag within said spindle body;
    a rotary motor for imparting rotational drive forces to said rotor shaft so as to rotate said shaft on said rotary air bearing at high speeds;
    a linear drive means for imparting an axially directed drive force to drive said along said shaft axis to perform drilling movements; and
    means for coupling said linear drive means to said rotor shaft to impart said drive force to said rotor shaft, said means comprising a thrust bearing and a linear air bearing;
    whereby said rotor shaft may be rotated at high speeds by said rotary motor and simultaneously translated along said axis to perform said drilling movements.

2. The drilling spindle of claim 1 wherein said rotary motor comprises an electric motor having a stator comprising a ferrous stator core encircling said rotor shaft and a plurality of stator windings of electrically conductive wire wound about axial slots formed in said core about said rotor shaft and a rotor comprising an elongated rotor region to conduct the rotor electrical currents, said region extending along said rotor shaft in the region encircled by said stator and having an elongated length such that the rotor length overlaps the stator length by a sufficient length to enable the rotor shaft to translate along a range of movement without significant degradation of the rotary motor function.

3. The drilling spindle of claim 2 wherein said elongated rotor region is formed by a plurality of elongated copper bars extending along the outer periphery of the rotor shaft in axial slots and which are connected on each end by copper rings embedded in the rotor shaft outer periphery.

4. The spindle of claim 3 wherein said rotary air bearing means comprises an upper sleeve member fixed within the spindle body and encircling an upper portion of said rotor shaft, a plurality of air orifices formed in said sleeve, and means for coupling said orifices to a supply of pressurized air.

5. The spindle of claim 1 wherein said rotary air bearing means comprises a lower sleeve member fixed within the spindle body and encircling a lower portion of said rotor shaft, a plurality of air orifices formed in said sleeve, and means for coupling said orifices to a supply of pressurized air.

6. The spindle of claim 1 further comprising a coolant system for conducting heat away from the spindle in the region of the rotary motor during high speed operation.

7. The spindle of claim 6 wherein said coolant system comprises a plurality of coolant passages about the rotary motor, and means for conducting a coolant fluid through said passages.

8. The spindle of claim 7 wherein said coolant system further comprises a pump for pumping the coolant to the passages and a heat exchanger coupled to a coolant outlet port for extracting heat energy from the exhausted fluid.

9. The spindle of claim 1 wherein said linear drive means comprises a linear motor having:
    a moving coil assembly having means for connection to a motor driver;
    a stator assembly comprising a permanent magnet assembly for co-action with said moving coil assembly to develop axially directed drive forces on said moving coil assembly in response to motor drive signals; and
    means for coupling said moving coil assembly to said rotor shaft for imparting said axial forces to said rotor shaft.

10. The spindle of claim 9 wherein said moving coil assembly comprises a metal cylinder having a conductive wire wound around the periphery thereof, with said wire being coupled to said motor driver, and wherein an electromotive force is exerted in an axial direction on the moving coil assembly in response to motor drive signals applied thereto.

11. The spindle of claim 9 wherein said means for coupling said moving coil assembly to said rotor shaft comprises a plunger having one end coupled to said rotor shaft by said thrust bearing and the other end coupled to said moving coil assembly, whereby said axial forces on the moving coil assembly are transmitted to said rotor shaft.

12. The spindle of claim 11 wherein said plunger is mounted within the spindle body on an air bearing, and the thrust bearing comprises an air bearing for coupling the rotor shaft to the plunger so as to reduce frictional drag between the rotor shaft and the plunger.

13. The spindle of claim 12 wherein said plunger is mounted within the spindle body for axial movement, and is coupled to said moving coil assembly by an anti-rotation bearing for preventing the plunger from rotating.

14. The spindle of claim 2 further comprising means for biasing the rotor shaft against the force of gravity so as to equalize the force required to be exerted by the linear motor to axially translate the rotor shaft in either axial direction.

15. The spindle of claim 14 wherein said position biasing means comprises a biasing spring means for supporting the weight of the rotor shaft.

16. The spindle of claim 1 further comprising a position sensor for providing a position signal indicative of a relative axial position of the rotor shaft.

17. The spindle of claim 16 further comprising a velocity sensor for providing a velocity signal indicative of the velocity of the rotor shaft along said shaft axis.

18. The spindle of claim 1 further comprising a rotary speed transducer for providing signals indicative of the rotational speed of the rotor shaft.

19. A high speed drilling spindle for a drilling system, comprising:
   a fixed spindle body;
   a rotatable rotor shaft supported within said spindle body for high speed rotation and linear translation along a rotor shaft axis;
   rotary fluid bearing means for supporting the rotor shaft for high speed rotation with low friction drag within said spindle body;
   means for securing a drilling tool at a first end of the rotor shaft in alignment with the shaft axis;
   means for imparting rotational drive forces to said rotor shaft so as to rotate said rotor shaft at high speeds;
   a linear motor drive means for imparting an axially directed drive force to drive said rotor shaft along said shaft axis to perform drilling movements; and
   means for coupling said linear drive means to said rotor shaft to impart said drive force to said rotor shaft, said means comprising a thrust bearing which in turn comprises an air bearing;
   whereby said rotor shaft may be rotated at high speeds by said rotary drive means and simultaneously translated along said axis to perform said drilling movements.

20. The spindle of claim 19 wherein said linear motor drive means comprises:
   a moving coil assembly having means for connection to a motor driver; and
   a stator assembly comprising a permanent magnet assembly for co-action with said moving coil assembly to develop axially directed drive forces on said moving coil assembly in response to motor drive signals; and
   said coupling means comprises means for coupling said moving coil assembly to said rotor shaft for imparting said axial forces to said shaft.

21. The spindle of claim 20 wherein said moving coil assembly comprises a metal cylinder having a conductive wire wound around the periphery thereof, with said wire being coupled to said motor driver, and wherein an electromotive force is exerted in an axial direction on the moving coil assembly in response to motor drive signals applied thereto.

22. The spindle of claim 20 wherein said means for coupling said moving coil assembly to said rotor shaft further comprises a plunger having one end coupled to a second end of said rotor shaft by said thrust bearing and the other end coupled to said moving coil assembly, whereby said axial forces on the moving coil assembly are transmitted to said rotor shaft.

23. The spindle of claim 22 wherein said air bearing is for coupling the rotor shaft to the plunger so as to reduce frictional drag between the rotor shaft and the plunger.

24. The spindle of claim 19 further comprising means for biasing the rotor shaft against the force of gravity so as to equalize the force required to be exerted by the linear motor to axially translate the rotor shaft in either axial direction.

25. The spindle of claim 24 wherein said position biasing means comprises a biasing spring means for supporting the weight of the rotor shaft.

26. The spindle of claim 19 further comprising a position sensor directly coupled to the rotor shaft for providing a position signal directly related to a relative axial position of the rotor shaft.

27. The spindle of claim 19 further comprising a velocity sensor directly coupled to the rotor shaft for providing a velocity signal directly related to the velocity of the rotor shaft along said shaft axis.

28. The spindle of claim 19 further comprising a rotary speed transducer for providing signals indicative of the rotational speed of the rotor shaft.

29. The drilling spindle of claim 19 wherein said rotational drive means comprises an electric motor having a stator comprising a ferrous stator core encircling said rotor shaft and a plurality of stator windings of electrically conductive wire wound about axial slots formed in said core about said rotor shaft, and a rotor comprising an elongated rotor region to conduct the rotor electrical currents, said region extending along said rotor shaft in the region encircled by said stator and having an elongated length such that the rotor length overlaps the stator length by a sufficient length to enable the rotor shaft to translate along a range of movement without significant degradation of the rotary motor function.

30. The drilling spindle of claim 29 wherein said elongated rotor region is formed by a plurality of elongated copper bars extending along the outer periphery of the rotor shaft in axial slots and which are connected on each end by copper rings embedded in the rotor shaft outer periphery.

31. The spindle of claim 19 further comprising a rotary air bearing for supporting the rotor shaft for high speed rotation with low frictional drag within said spindle body, said air bearing comprising an upper sleeve member fixed within the spindle body and encircling an upper portion of said motor shaft, a plurality of air orifices formed in said sleeve, and means for coupling said orifices to a supply of pressurized air.

32. The spindle of claim 31 wherein said rotary air bearing means comprises a lower sleeve member fixed within the spindle body and encircling a lower portion of said motor shaft, a plurality of air orifices formed in said sleeve, and means for coupling said orifices to a supply of pressurized air.

33. The spindle of claim 19 further comprising a coolant system for conducting heat away from the spindle in the region of the rotary drive means during high speed operation.

34. The spindle of claim 33 wherein said coolant system comprises a plurality of coolant passages about the rotary drive means, and means for conducting a coolant fluid through said passages.

35. The spindle of claim 34 wherein said coolant system further comprises a pump for pumping the coolant to the passage and a heat exchanger coupled to a coolant outlet port for extracting heat energy from the exhausted fluid.

36. A high speed drilling spindle for a drilling system, comprising:
   a fixed spindle body;
   a rotatable rotor shaft supported within said spindle body for high speed rotation and linear translation along the rotor shaft axis;
   first and second rotary fluid bearings fixed with respect to the linear translation of said rotor axis, said bearings separated by a fixed distance for supporting the rotor shaft for high speed rotation with low frictional drag within said spindle body;

means for securing a drilling tool at a first end of the rotor shaft in alignment with the shaft axis;

means for imparting rotational drive forces to said rotor shaft so as to rotate said rotor shaft at high speeds;

linear drive means for imparting an axially directed drive force to drive said rotor shaft along said rotor shaft axis to perform drilling movements;

means for coupling said linear drive means to said rotor shaft to transfer said axially directed drive force to said rotor shaft, said means comprising a thrust bearing which is not required to sustain any substantial radial load, wherein said rotor shaft may be rotated a high speeds by said rotary drive means and simultaneously translated along said axis with high dynamic stability to perform said drilling movements.

37. The drilling spindle of claim 36 wherein said rotary motor comprises an electric motor having a stator comprising a ferrous stator core encircling said rotor shaft and a plurality of stator windings of electrically conductive wire wound about axial slots formed in said core about said rotor shaft, and a rotor comprising an elongated rotor region to conduct the rotor electrical currents, said region extending along said rotor shaft in the region encircled by said stator and having an elongated length such that the rotor length overlaps the stator length by a sufficient length to enable the rotor shaft to translate along a range of movement without significant degradation of the rotary motor function.

38. The drilling spindle of claim 37 wherein said elongated rotor region is formed by a plurality of elongated copper bars extending along the outer periphery of the rotor shaft in axial slots and which are connected on each end by copper rings embedded in the rotor shaft outer periphery.

39. The spindle of claim 38 wherein said rotary air bearing means comprises an upper sleeve member fixed within the spindle body and encircling an upper portion of said rotor shaft, a plurality of air orifices formed in said sleeve, and means for coupling said orifices to a supply of pressurized air.

40. The spindle of claim 36 wherein said first rotary fluid bearing means comprises a lower sleeve member fixed within the spindle body and encircling a lower portion of said rotor shaft, a plurality of fluid orifices formed in said sleeve, and means for coupling said orifices to a supply of pressurized fluid.

41. The spindle of claim 36 wherein said second rotary fluid bearing means comprises an upper sleeve member fixed within the spindle body and encircling an upper portion of said rotor shaft, a plurality of fluid orifices formed in said sleeve, and means for coupling said orifices to a supply of pressurized fluid.

42. The spindle of claim 36 wherein said linear drive means comprises a linear motor having:

a moving coil assembly having means for connection to a motor driver;

a stator assembly comprising a permanent magnet assembly for co-action with said moving coil assembly to develop axially directed drive forces on said moving coil assembly in response to motor drive signals; and means for coupling said moving coil assembly to said rotor shaft for impairing said axial forces to said rotor shaft.

43. The spindle of claim 42 wherein said moving coil assembly comprises a metal cylinder having a conductive wire wound around the periphery thereof, with said wire being coupled to said motor driver, and wherein an electromotive force is exerted in an axial direction on the moving coil assembly in response to motor drive signals applied thereto.

44. The spindle of claim 42 wherein said means for coupling said moving coil assembly to said rotor shaft comprises a plunger member having one end coupled to said rotor shaft by said thrust bearing and the other end coupled to said moving coil assembly, whereby said axial forces on the moving coil assembly are transmitted to said rotor shaft.

45. The spindle of claim 44 wherein said plunger is mounted within the spindle body on an air bearing, and the thrust bearing comprises an air bearing for coupling the rotor shaft to the plunger so as to reduce frictional drag between the rotor shaft and the plunger.

46. The spindle of claim 45 wherein said plunger is mounted within the spindle body for axial movement, and is coupled to said moving coil assembly by an anti-rotation bearing for preventing the plunger from rotating.

47. The spindle of claim 37 further comprising means for biasing the axial rotor shaft position against the force of gravity so as to equalize the force required to be exerted by the linear motor to axially translate the rotor shaft in either axial direction.

48. The spindle of claim 47 wherein said position biasing means comprises a biasing spring means for supporting the weight of the rotor shaft.

49. The spindle of claim 36 wherein said rotor is rotatable at speeds of 80,000 revolutions per minute or higher.

50. A high speed drilling spindle for a drilling system comprising:

a fixed spindle body;

a rotatable rotor shaft supported within said spindle body for high speed rotation and linear translation along the rotor shaft axis;

means for securing a drilling tool at a first end of the rotor shaft in alignment with the shaft axis;

means for imparting rotational drive forces to said rotor shaft so as to rotate said rotor shaft at high speeds;

a linear motor drive means for imparting an axially directed drive force to drive said rotor shaft along said shaft axis to perform drilling movements, said linear motor drive means comprising a moving coil assembly having means for connection to a motor driver, a stator assembly comprising a permanent magnet assembly for co-action with said moving coil assembly to develop axially directed drive forces on said moving coil assembly in response to motor drive signals, and means for coupling said moving coil assembly to said rotor shaft for imparting said axial forces to said shaft;

wherein said means for coupling said moving coil assembly to said rotor shaft comprises a thrust bearing and a plunger having one end coupled to a second end of said rotor shaft by said thrust bearing and the other end coupled to said moving coil assembly, and whereby said axial forces on the moving coil assembly are transmitted to said rotor shaft, and wherein said plunger is mounted within the spindle body on an air bearing, and the thrust bearing comprises an air bearing for coupling the rotor shaft to the plunger so as to reduce frictional drag between the rotor shaft and the plunger;

whereby said rotor shaft may be rotated at high speeds by said rotary drive means and simultaneously translated along said axis to perform said drilling movements.

51. The spindle of claim 50 wherein said plunger is mounted within the spindle body for axial movement, and is coupled to said moving coil assembly by an anti-rotation bearing for preventing the plunger from rotating.

* * * * *